United States Patent
Shioya et al.

[11] Patent Number: 6,091,382
[45] Date of Patent: Jul. 18, 2000

[54] DISPLAY DEVICE FOR PERFORMING DISPLAY OPERATION IN ACCORDANCE WITH SIGNAL LIGHT AND DRIVING METHOD THEREFOR

[75] Inventors: Masaharu Shioya, Akiruno; Tomoyuki Shirasaki; Hiroyasu Yamada, both of Hachioji, all of Japan

[73] Assignee: Casio Computer Co., Ltd., Tokyo, Japan

[21] Appl. No.: 08/774,162

[22] Filed: Dec. 26, 1996

[30] Foreign Application Priority Data

Dec. 30, 1995 [JP] Japan .................................. 7-352663
Jan. 31, 1996 [JP] Japan .................................. 8-035679

[51] Int. Cl.$^7$ .................................................. G09G 3/30
[52] U.S. Cl. .............................. 345/76; 345/77; 345/81; 315/169.3; 313/504; 313/507
[58] Field of Search .................................. 345/74, 76, 77, 345/80, 81, 44, 207; 313/504, 505, 507; 315/169.3

[56] References Cited

U.S. PATENT DOCUMENTS

| | | |
|---|---|---|
| 3,710,181 | 1/1973 | Tanaka et al. . |
| 3,767,392 | 10/1973 | Ota ............................................. 430/35 |
| 4,356,429 | 10/1982 | Tang . |
| 4,695,717 | 9/1987 | Hirai et al. . |
| 4,808,880 | 2/1989 | Thioulouse ............................... 313/507 |
| 4,877,995 | 10/1989 | Thioulouse et al. ..................... 313/507 |
| 5,053,675 | 10/1991 | Thioulouse ............................... 313/505 |
| 5,053,679 | 10/1991 | Thioulouse ........................... 315/169.3 |
| 5,055,739 | 10/1991 | Thioulouse ............................... 313/507 |
| 5,231,282 | 7/1993 | Nishi et al. ........................ 250/214 LA |
| 5,243,332 | 9/1993 | Jacobson ................................... 345/44 |
| 5,304,895 | 4/1994 | Ujihara ..................................... 315/72 |
| 5,446,564 | 8/1995 | Mawatari et al. ......................... 359/72 |
| 5,606,343 | 2/1997 | Tsuboyama et al. ..................... 345/97 |
| 5,657,100 | 8/1997 | Yamamoto et al. ...................... 349/41 |

FOREIGN PATENT DOCUMENTS

| | | |
|---|---|---|
| 384829 | 2/1990 | European Pat. Off. . |
| 382642 | 8/1990 | European Pat. Off. . |
| WO 96/33594 | 10/1996 | WIPO . |

*Primary Examiner*—Dennis-Doon Chow
*Assistant Examiner*—Amr Awad
*Attorney, Agent, or Firm*—Frishauf, Holtz, Goodman, Langer & Chick, P.C.

[57] ABSTRACT

A display device includes an EL element for signal light which is based on the segment matrix drive scheme and causes a plurality of areas to emit signal light containing light in a wavelength range other than the visible range, a photoconductive layer which generates carriers upon incidence of signal light, and an EL element for display light which is adjacent to the photoconductive layer. Signal light is irradiated onto desired areas of the photoconductive layer. Carriers are injected from the irradiated areas into the EL layer to emit display light containing visible light.

9 Claims, 32 Drawing Sheets

DISPLAY DEVICE FOR PERFORMING DISPLAY OPERATION IN ACCORDANCE WITH SIGNAL LIGHT AND DRIVING METHOD THEREFOR

BACKGROUND OF THE INVENTION

The present invention relates to a display device for performing a display operation in accordance with signal light and, more particularly, to a display device designed to perform a high time-division drive display operation.

Display devices are classified into display elements which do not emit light by themselves, like liquid crystal display elements, but perform display operations by using external light such as light from backlights and the like, and self-luminescent or spontaneous display elements which perform display operations by emitting light by themselves. One example of the self-luminescent display elements is an organic electro-luminescent element (to be referred to as an organic EL element hereinafter) which has a luminescence mechanism having a luminescent layer consisting of an organic material and designed to emit light by using excitation energy generated by recombination of carriers, i.e., electrons and holes as particles having charges with different polarities, in the luminescent layer.

In a simple matrix type organic EL element having a plurality of scanning electrodes and signal electrodes formed on the upper and lower surfaces of the luminescent layer, which causes recombination, to extend in different directions, a voltage is sequentially applied to emit light. In this element, however, as the number of scanning electrodes is increased to realize a high-resolution display operation, the scanning time during which a scanning voltage is applied to one scanning electrode in 1 frame period is shortened, resulting in a decrease in emission luminance at each pixel. In addition, the luminescent layer emits light at the maximum luminance upon application of a voltage, but the luminance decreases instantaneously afterward. With this property, the luminescent layer has a poor memory function. For this reason, in some driving methods, the maximum luminance is increased to apparently maintain luminescence in 1 frame period. However, in order to obtain a sufficient contrast ratio at $1/100$ duty, the maximum luminance must be set to about several thousand to 10,000 cd/m$^2$. In this case, since crosstalk occurs, it is difficult to perform a proper display operation. Furthermore, since an excessive load is imposed on the luminescent layer, the luminescence life time is considerably shortened.

A technique of improving the memory function by using switching elements such as thin-film transistors (TFTS) and the like has been proposed. According to this technique, however, the switching elements lead to a decrease in the opening ratio (the ratio of the emission area), resulting in a decrease in emission luminance. The switching elements also complicate the manufacturing process, resulting in a decrease in yield. Furthermore, variations in the gate voltage/drain current characteristics of TFTs cause variations in display luminance among the respective pixels. Consider a substrate having TFTs. Since materials for elements constituting a TFT have high film formation temperatures, a thin, lightweight, flexible substrate such as a film substrate cannot be used. Such problems become more serious in elements having larger display areas.

BRIEF SUMMARY OF THE INVENTION

It is an object of the present invention to provide a display device whose load is small and which performs a proper high time-division display operation with little variation in luminance and little crosstalk among pixels, and to realize a high-resolution, large screen having a high opening ratio and a very low profile.

In order to achieve the above object, according to the present invention, there is provided a display device for performing a display operation in accordance with signal light, comprising photoconductive means for generating carriers therein in accordance with the signal light incident therein, first conductive means formed on one side of the photoconductive means, luminescent means, formed on the other side of the photoconductive means, for emitting light in a predetermined wavelength range in accordance with injection of carriers therein, and second conductive means formed on an opposite side of the luminescent means to the side thereof on which the photoconductive means is formed.

The display device of the present invention includes the photoconductive means for generating carriers therein in accordance with incidence of signal light. With this arrangement, if light which generates carriers is not irradiated onto an area in the photoconductive means which corresponds to a non-selected pixel while a predetermined voltage is applied between the first and second conductive means, since almost no carriers are injected into the area of the luminescent means which corresponds to the non-selected pixel, no light is emitted. If light which generates carriers is irradiated onto an area in the photoconductive means which corresponds to a selected pixel, carriers are injected from between the first and second conductive means into the luminescent means through the photoconductive means. As a result, light in a predetermined wavelength range is emitted upon recombination in accordance with injection of the carriers. Once signal light becomes incident on the selected pixel, carriers generated in the photoconductive means are kept stored for a predetermined period of time. Injection of carriers from between the first and second conductive means can be continued, thereby realizing light emission with a memory function. As described above, if signal light is irradiated on only the area in the photoconductive means which corresponds to a selected pixel, since an area corresponding to a non-selected pixel is in an insulated state, injection of carriers is suppressed. Therefore, substantially no crosstalk occurs.

According to the present invention, there is provided a display device for performing a display operation in accordance with signal light, comprising an addressing element having a plurality of areas for emitting the signal light, and a display element having a light-receiving element for receiving the signal light and generating carriers corresponding to the signal light and serving to perform a display operation in accordance with the carriers generated by the light-receiving element.

When, therefore, signal light is irradiated from an arbitrary area of the plurality of areas of the addressing element onto a corresponding area of the light-receiving element, carriers are generated in this corresponding area. The display element can perform a display operation in accordance with the carriers.

It is the second object of the present invention to provide a driving method for a display device, the load on which is small, and which can perform a proper high time-division display operation with little variation in luminance and little crosstalk among pixels.

According to the present invention, there is provided a driving method for a display device for emitting display light, comprising the steps of applying a display voltage to a pair of display electrodes sandwiching a photoconductive layer which receives signal light and generates carriers in accordance with the signal light and a display layer which emits the display light containing light in a wavelength range that generates carriers in the photoconductive layer in accordance with injection of carriers into the display layer, sequentially irradiating the signal light from different areas of an addressing element having a plurality of areas for emitting the signal light onto areas of the photoconductive layer which correspond to the areas of the addressing element, and generating carriers in the photoconductive layer by irradiating the display light onto the photoconductive layer in accordance with carriers generated in the photoconductive layer upon irradiation of the signal light from the addressing element, the display layer emitting the display light in accordance with carriers injected into the display layer upon application of the display voltage.

According to this embodiment, signal light emitted from a predetermined area of the addressing element reaches a corresponding area of the photoconductive layer, and the display layer emits display light. Since the display light is irradiated onto the area of the photoconductive layer, and the area of the photoconductive layer generates carriers again, carriers remain in the area of the photoconductive layer even after the display light is emitted. Emission of display light from the display layer can therefore be sustained.

According to the present invention, there is provided a driving method for a display device for performing a display operation in accordance with signal light, comprising the steps of sequentially irradiating write signal light from different areas of an addressing element having a plurality of areas for selectively emitting the write signal light or reset signal light during an address write period onto a plurality of areas of, a photoconductive layer for generating carriers therein in accordance with incidence of the write signal light or the reset signal light, which correspond to the plurality of areas of the addressing means, applying a display voltage to a pair of display electrodes sandwiching an area of the photoconductive layer on which the write signal light is irradiated and a display layer which emits the display light in accordance with injection of carriers therein during the address write period, sequentially irradiating the reset signal light from different areas of the addressing element during an address reset period, and applying a reset voltage to the pair of display electrodes sandwiching an area of the photoconductive layer on which the reset signal light is irradiated and the display layer, thereby substantially refreshing carriers stored in the photoconductive layer.

As described above, display data based carriers stored during the address write period can be erased by applying reset signal light and a reset voltage to the area of the display area which is used for a display operation in the address reset period. With this operation, when this area is to be used to display an image different from the previous image in the next frame period, this display operation is not adversely affected by carriers generated in the previous frame period.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments below, serve to explain the principles of the invention.

DETAILED DESCRIPTION OF THE INVENTION

An organic EL element according to each embodiment of the present invention will be described in detail below with reference to the accompanying drawings.

First Embodiment

Figure 1:
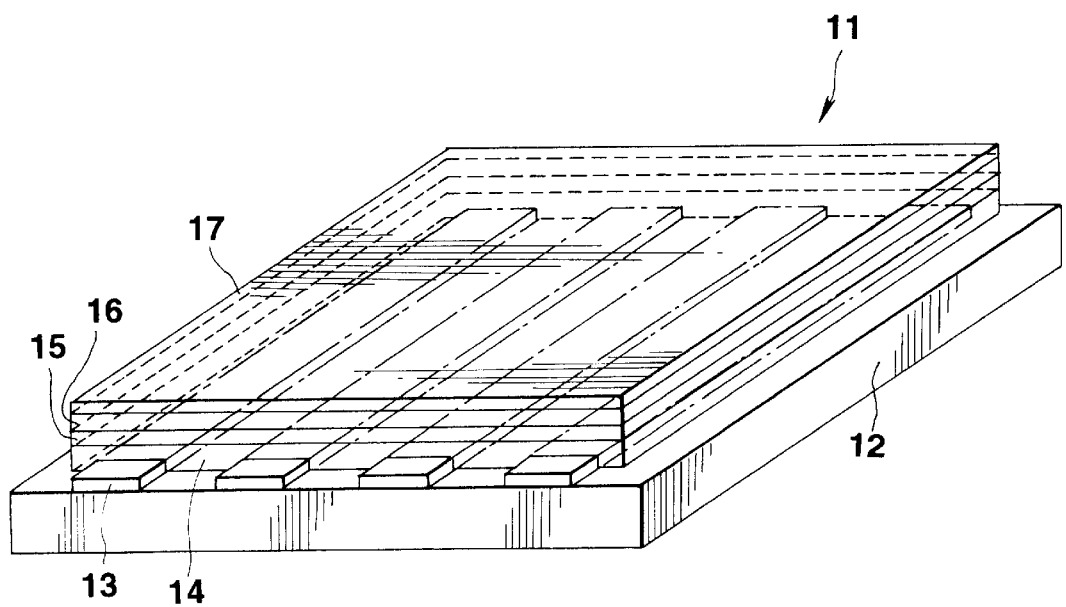
FIG. 1 is a perspective view showing an organic EL element for display light according to the present invention.

FIG. 1 is a perspective view showing the schematic arrangement of an organic EL element according to the first embodiment. Referring to FIG. 1, reference numeral 11 denotes an organic EL element, in which a plurality of striped cathode electrodes 13 exhibiting high transparency with respect to light in the wavelength range of 200 nm to 830 nm, including ultraviolet and visible light, are formed on a transparent substrate 12 exhibiting high transparency with respect to light in the wavelength range of 200 nm to 830 nm and consisting of an electrically insulating glass or synthetic resin material, and a photoconductive layer 14 is formed to cover the substrate 12 and the cathode electrodes 13. An electron transport layer (ETL) 15, a luminescent layer (LL) 16 also serving as a hole transport layer (HTL), and an anode electrode 17 exhibiting high transparency with respect to light in the wavelength range of 360 nm to 830 nm are sequentially stacked on the photoconductive layer 14. In the present invention, ultraviolet light is defined as an electromagnetic wave having a wavelength of 1 nm (inclusive) to 400 nm (exclusive), and visible light is defined as an electromagnetic wave having a wavelength of 400 nm (inclusive) to 800 nm (inclusive).

A material having a small work function value for a high electron injection efficiency and exhibiting high transparency with respect to light in the wavelength range of 200 nm to 830 nm is preferably used for each cathode electrode 13. The anode electrode 17 is a thin film having a thickness of 50 nm to 150 nm and consisting of ITO ($In_2O_3$—$SnO_2$) or IXO ($In_2O_3$—$ZnO$) having a sheet resistance of 50Ω or less. The photoconductive layer (PCL) 14 exhibits insulating properties when light in a predetermined wavelength range is not incident, and generates electron-hole pairs, i.e., carriers, therein in accordance with incidence of light in the predetermined wavelength range.

The luminescent layer 16 is made of a mixture of poly (N-vinylcarbazole) (to be referred to as PVCz hereinafter) as a binder/hole transport material, 2,5-bis(1-naphthyl)-oxadiazole (to be referred to as BND hereinafter), and 3-(2'-benzothiazoyl)-7-dithylaminocoumarin (to be referred to as coumarin 6 hereinafter) as a luminescent material. PVCz itself has a hole transport property, and serves as a dispersion material for suppressing concentration quenching due to the hydrogen bonds of coumarin 6. It is difficult to form a film by using only BND and a luminescent material. PVCz functions as a binder for binding these compounds.

The followings are the chemical formulae of PVCz, BND, and coumarin 6:

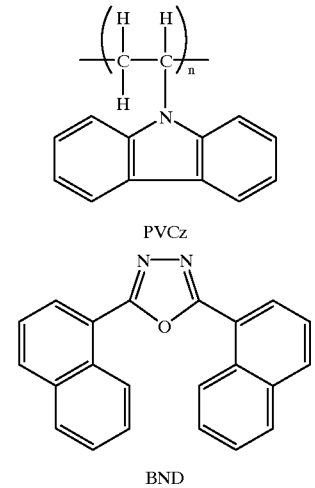

-continued

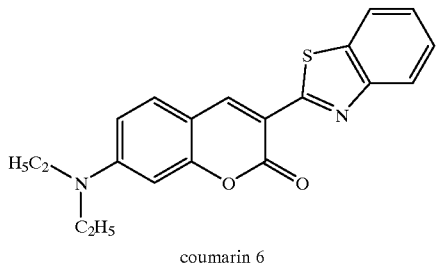

coumarin 6

Coumarin 6 is mixed at a molar ratio of about 3/100 with respect to the one N-vinylcarbazole (VCz) unit of PVCz. Coumarin 6 causes light emission by excitons generated by recombination of electrons and holes in the luminescent layer 16. BND is mixed at a molar ratio of about 17/100 with respect to the one VCz unit. BND has a relative band gap that encourages injection of electrons into the luminescent layer 16 and injection/transport of holes into the luminescent layer 16. Since the luminescent layer 16 as a single layer having a thickness of 20 nm to 100 nm, more preferably 65 nm to 80 nm, is formed to be adjacent to the anode electrode 17, holes are directly injected from the anode electrode 17 into the luminescent layer 16.

The electron transport layer 15 is a single-layer film consisting of tris(8-quinolinolate)aluminum complex (to be referred to as Alq3 hereinafter). The electron transport layer 15 serves to inject electrons into the luminescent layer 16. The following is the chemical formula of Alq3:

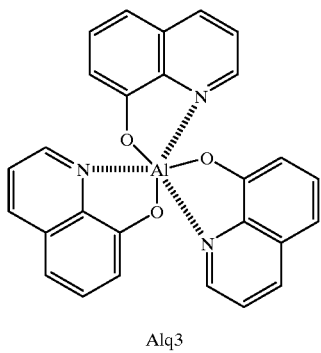

Alq3

Figure 2:
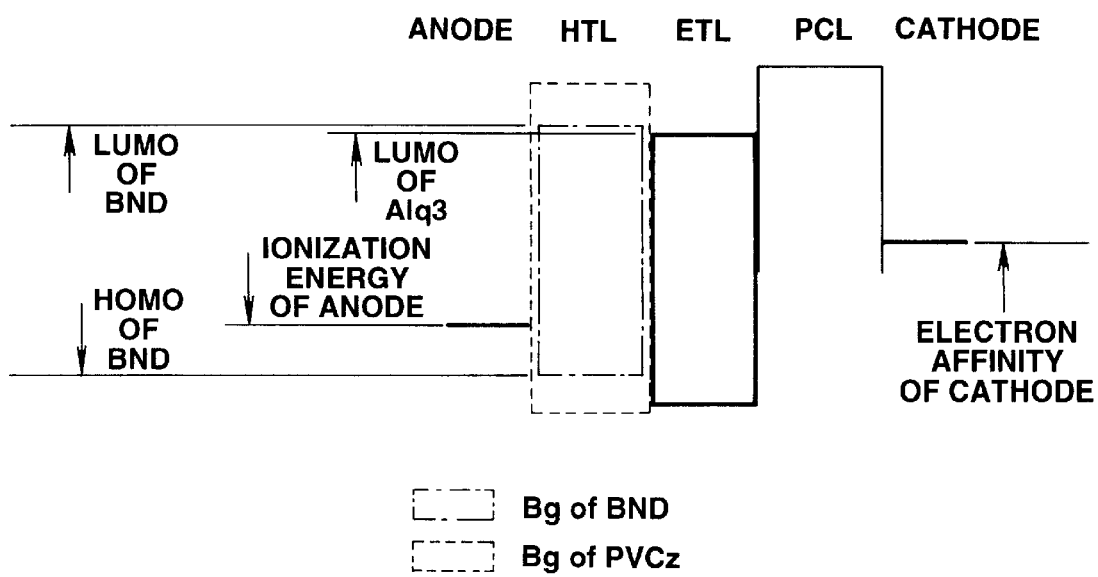
FIG. 2 is a view showing the energy diagram of the organic EL element for display light according to the present invention.

FIG. 2 shows the energy diagram of an organic EL element having a carrier transport layer structure constituted by two layers, i.e., a luminescent layer consisting of PVCz, BND, and coumarin 6 and an electron transport layer consisting of Alq3. The mobility of electrons in the organic carrier transport layer depends on the lowest unoccupied molecular orbital (LUMO) of each material, whereas the mobility of holes depends on the highest occupied molecular orbital (HOMO) of each material. In other words, the movement of these particles having charges reflects the upper and lower limits of the intrinsic band gap of each material. From the viewpoint of the entire structure including the electrodes, the behavior of electrons reflects the electron affinity (unit: eV) of each material, whereas the behavior of holes reflects the ionization energy (unit: eV) of each material.

In the organic EL element 11, a predetermined DC voltage or AC voltage is applied between each cathode electrode 13 and the anode electrode 17. While predetermined light is not incident on the photoconductive layer 14, the photoconductive layer 14 is set in as insulated state in the direction of thickness. With this setting, sufficient carriers for light emission are not injected into the ETL 15 and the HTL 16, and no light emission occurs.

Figure 5:
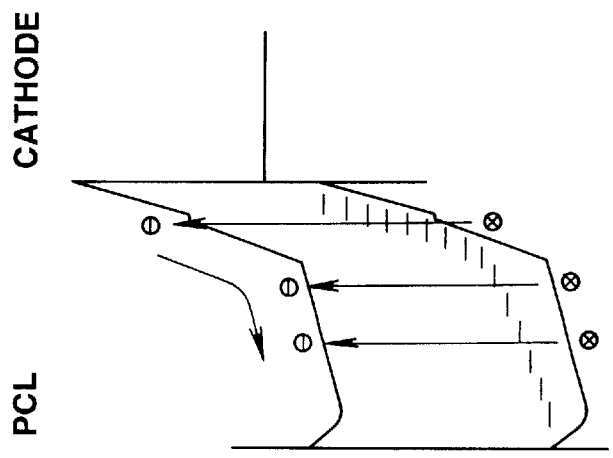
FIG. 5 is a view showing mechanisms in which electrons of a cathode electrode inject in accordance with signal light into the photoconductive layer.
Figure 4:
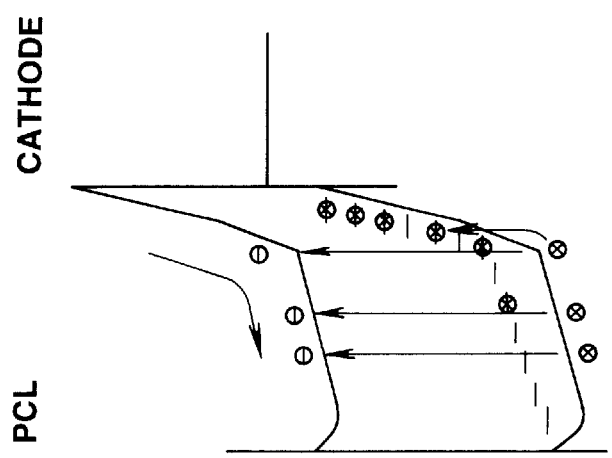
FIG. 4 is a view showing mechanisms in which carriers accumulate in accordance with signal light in the photoconductive layer.
Figure 3:
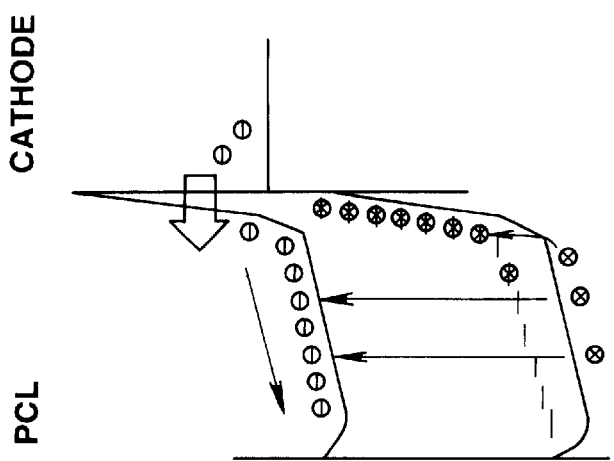
FIG. 3 is a view showing mechanisms in which carriers generate in accordance with signal light in the photoconductive layer.

FIGS. 3, 4, and 5 show a mechanism at the interface between the PCL and the cathode electrode in a case wherein signal light is incident on the PCL while a voltage is applied between the anode electrode and the cathode electrode. Since a Schottky junction is formed between the PCL and the cathode electrode, the applied voltage is mainly applied to the depletion layer. As indicated by the arrow in FIG. 3, electron-hole pairs generated in the PCL upon incidence of signal light in a predetermined wavelength range start to move along the electric field. The generated electrons move toward the ETL. As shown in FIG. 4, the generated holes are trapped at the energy level present near the interface on the cathode electrode side and gradually stored in accordance with the amount of incident light. As shown in FIG. 5, a high electric field is applied to the depletion layer, so that injection of electrons into the PCL is caused by tunneling. If the amount of light entering the PCL is large, since electron-hole pairs are generated in large quantities at the incident plane, the recombination rate is high, and the life times of electrons and holes are very short. For this reason, a large quantity of electrons cannot be injected. If the amount of incident light is small, it takes time for holes to be trapped at the interface. Similarly, therefore, a sufficient quantity of electrons cannot be injected. The amount of carriers injected is properly set in accordance with the wavelength range of signal light, the incidence time and amount of light incident on the PCL, the photoconductive characteristics of the PCL, and the applied voltage.

According to the luminescence mechanism of the organic EL element, as shown in FIG. 2, first of all, electrons generated in the photoconductive layer upon incidence of light and electrons injected from the electrodes into the photoconductive layer upon application of a voltage and incidence of light, are injected into the electron transport layer (ETL). Consider injection of holes from the anode electrode into the hole transport layer (HTL). Although there is a potential barrier between the ionization energy of the anode and the HOMO of the material in the HTL, a voltage is applied between the cathode and the anode to realize the injection of holes.

Figure 6:
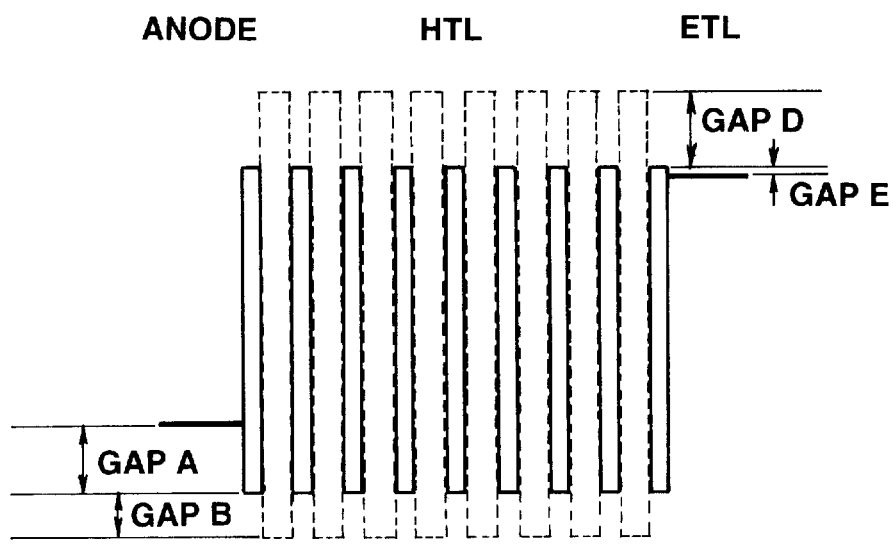
FIG. 6 is a view illustrating the movement of carriers in an HTL.

Consider the movement of holes in the HTL next. As shown in FIG. 6, hopping conduction dominates; the holes hop around the trapping sites formed in the mixture of PVCz and BND. More specifically, the holes which hop a gap A between the ionization energy of the anode and the HOMO of BND upon application of a voltage sequentially hop a gap B between the HOMO of BND and the HOMO of PVCz and move toward the ETL. The electrons injected into Alq3 hop a gap E upon application of a voltage. However, since a gap D is large, most of the electrons stay near the interface between the HTL and the ETL to recombine with the holes transported in the HTL. As a result, single excitons having no charge are generated. The singlet excitons irregularly move by about 10 nm, and are deactivated afterward. However, the singlet excitons are trapped in a luminescent material such as coumarin 6 to emit display light in a predetermined wavelength range, including visible light.

Figure 7:
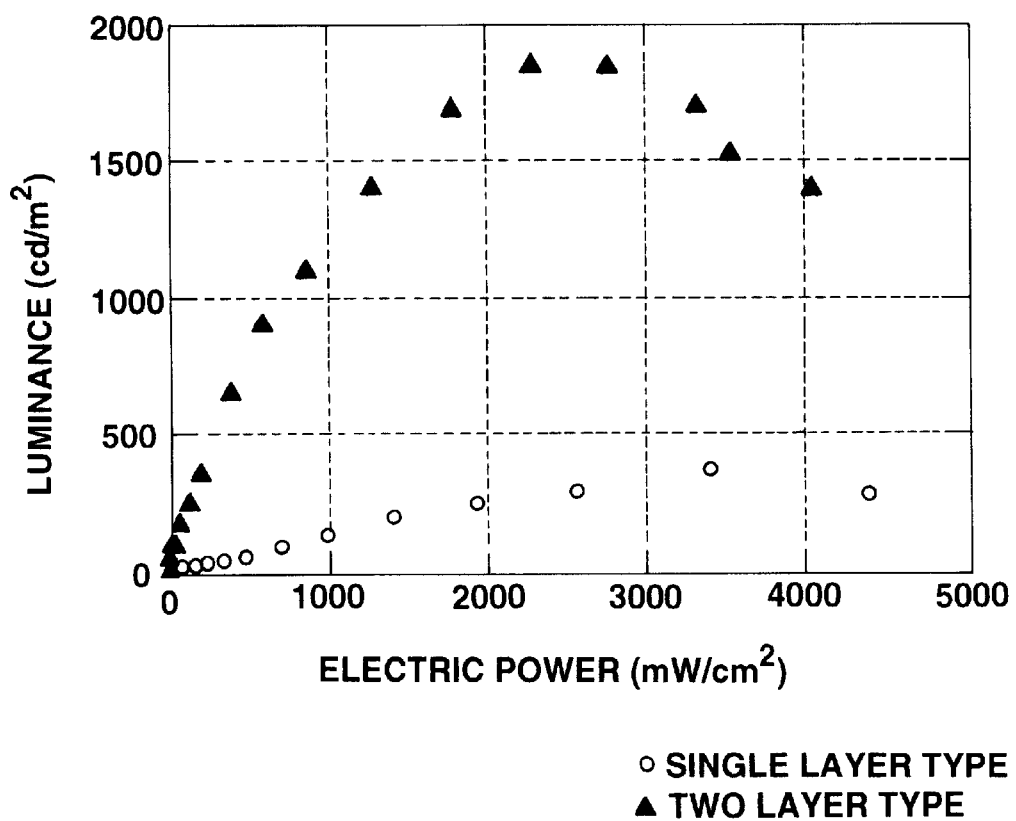
FIG. 7 is a graph showing the luminous efficacies of organic EL layers having two- and single-layer structures.

FIG. 7 shows the electric power per unit area/luminance characteristics of the organic EL element of the present invention, which has a two-layer structure constituted by a 50-nm thick hole transport layer consisting of PVCz, BND, and coumarin 6 and a 50-nm thick electron transport layer consisting of Alq3, together with the electric power per unit area/luminance characteristics of an organic EL element as a comparative example which has a single-layer structure having a 100-nm thick hole transport layer consisting of PVCz, BND, and coumarin 6. It was confirmed that the luminous efficacy of the organic EL element having the two-layer structure was much higher than that of the element having the single-layer structure, and the maximum luminance of the two-layer type is about six times that of the single-layer type.

Figure 8:
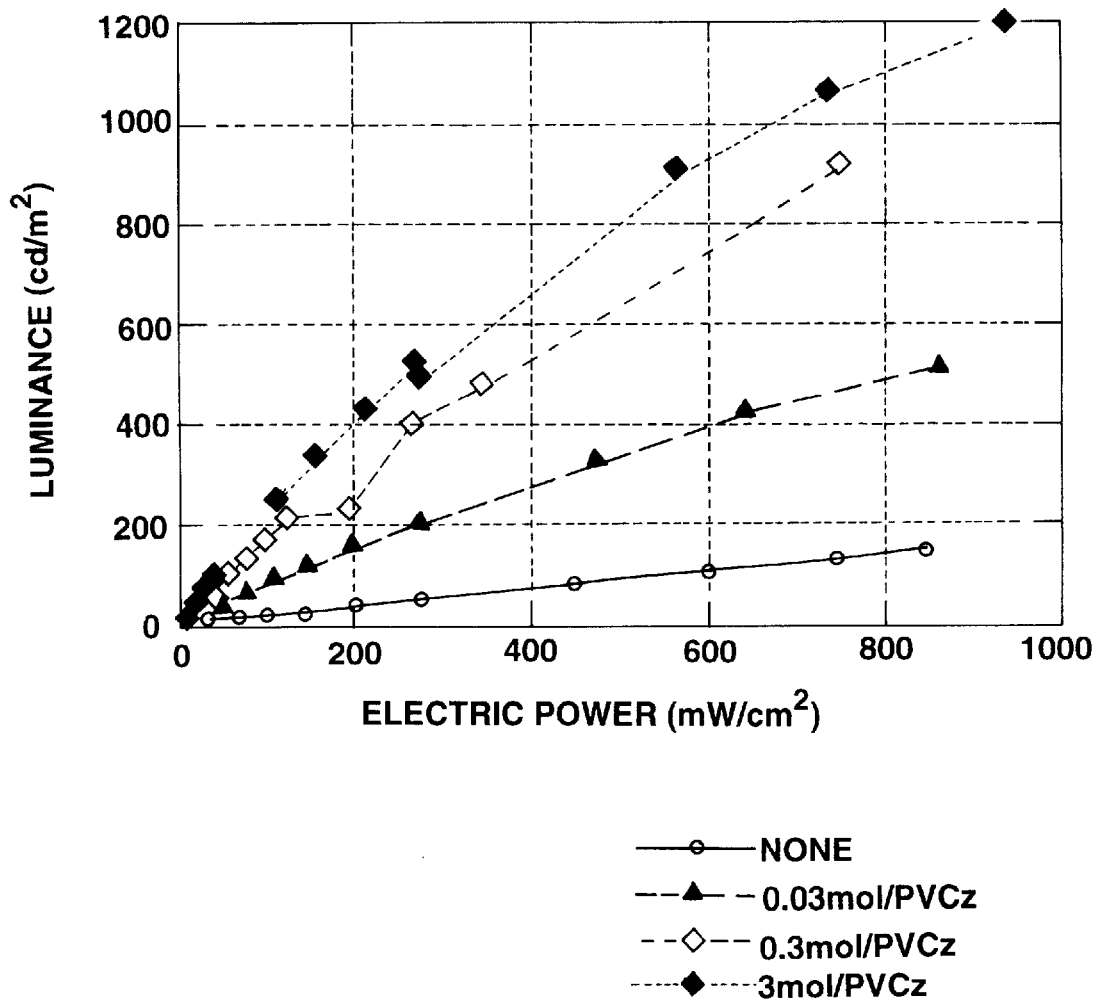
FIG. 8 is a graph showing the luminance characteristics of a luminescent layer in which a luminescent material is added.

FIG. 8 shows the molarity/luminance characteristics of coumarin 6 mixed in the hole transport layer with respect to the one VCz unit. As the molarity of coumarin 6 increased, the luminous efficacy increased. When the molarity of coumarin 6 changed from 0% to 3%, the element exhibited the highest luminous efficacy at 3%.

Figure 9:
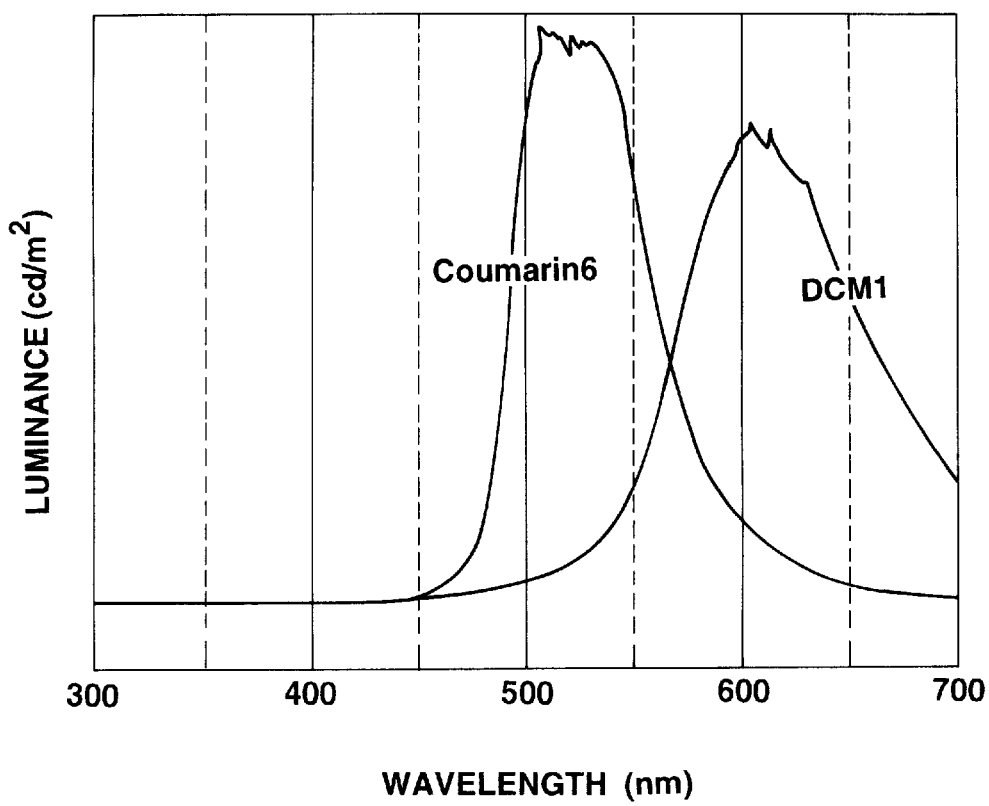
FIG. 9 is a graph showing the emission spectrum of each type of luminescent material.

FIG. 9 shows the emission spectra of luminescent materials. Coumarin 6 emits green light having an emission peak near 525 nm. In contrast to this, 4-(dicyanomethylene)-2-methyl-6-(p-dimethylamino-styryl)-4H-pyran (to be referred to as DCM1 hereinafter) emits orange or red light having an emission peak near 600 nm. The following is the chemical formula of DCM1:

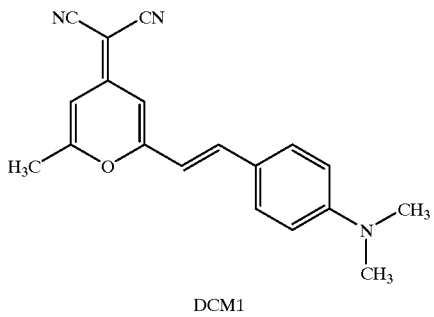

DCM1

Tetraphenylbenzidien (TPB) is available as a blue phosphor. Other blue phosphors are 4,4'-bis(2,2'-diphenylvinylene)biphenyl, 4,4'-bis((2-carbazole)vinylene) biphenyl, a tetraphenylbutadiene derivative, a cyclopentadiene derivative, an oxadiazole derivative, and the like.

The following is the chemical formula of TPB:

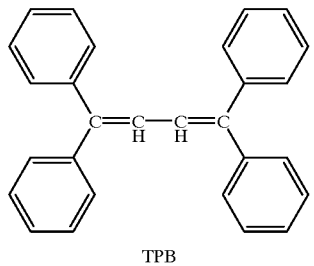

TPB

As described above, in the two-layer type organic EL element of the present invention, the HTL 16 undergoes a singlet excited state first, and the luminescent material then emits visible light. If luminescent materials (fluorescent materials) exhibiting high absorbing properties in the ultraviolet range and emitting light in predetermined wavelength ranges, e.g., light in different wavelength ranges such as red light, green light, and blue light, are arranged together in a predetermined area of the luminescent layer, a multicolor luminescent display operation can be performed.

Since the organic EL element of the present invention uses Alq3 for the electron transport layer and PVCz, BND, and a luminescent material for the luminescent layer, the luminous efficacy is very high, and light of an arbitrary color can be emitted.

As described above, when signal light is incident on a predetermined area of the photoconductive layer 14, electrons are injected from the cathode electrode 13 in the area, and display light is emitted from only the corresponding area of the HTL 16. However, no display light is emitted from the remaining areas on which no signal light is incident, even if a voltage is applied between the anode electrode 17 and the cathode electrodes 13. For this reason, substantially no crosstalk occurs, and gradation light emission can be performed in accordance with the amount of signal light.

Figure 10:
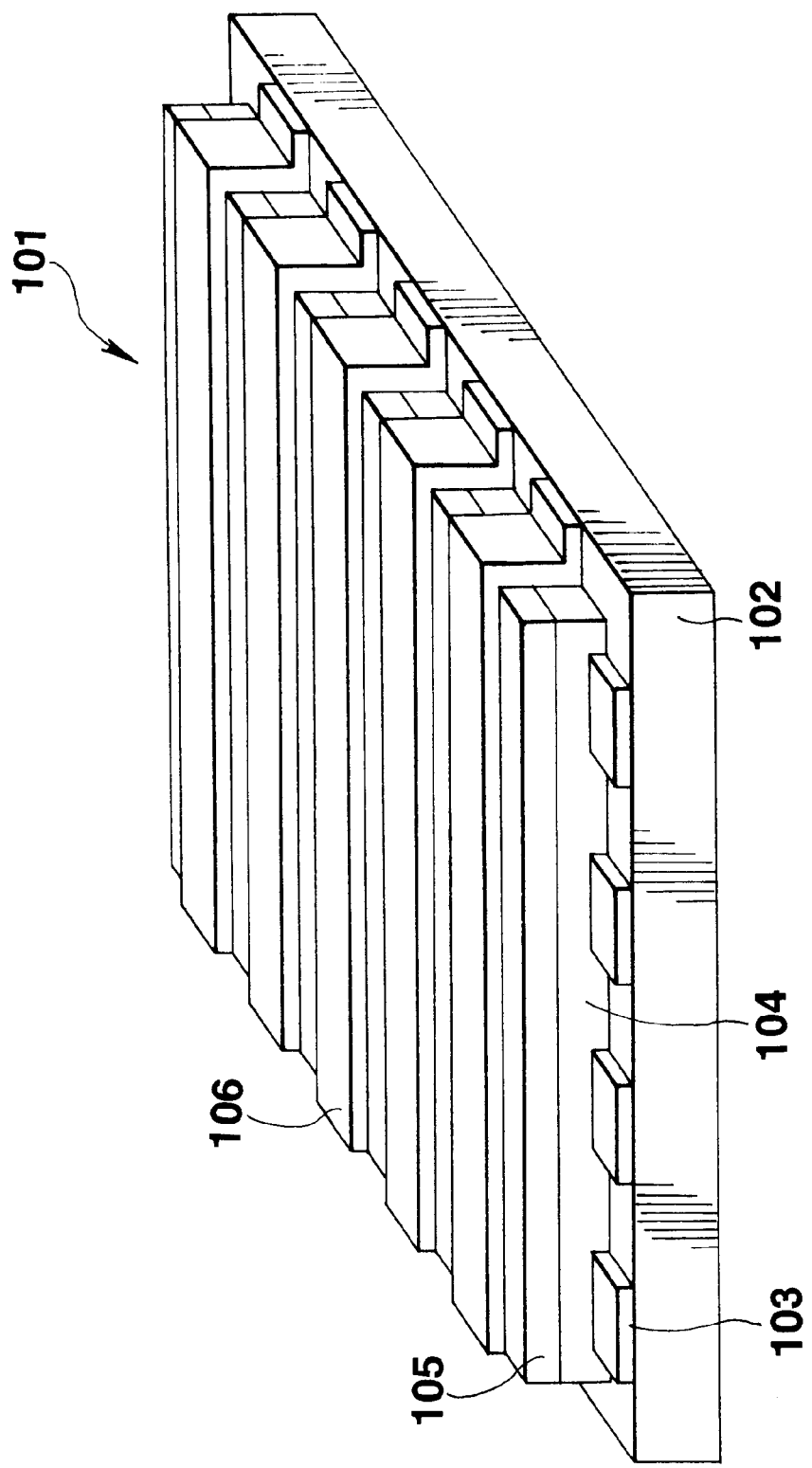
FIG. 10 is a perspective view showing an organic EL element for signal light.

FIG. 10 shows an organic EL element for emitting signal light for address light emission of the organic EL element 11. Referring to FIG. 10, reference numeral 101 denotes an organic EL element, in which a plurality of striped cathode electrodes 103, an electron transport layer 104, a luminescent layer 105 also serving as a hole transport layer, and a plurality of striped anode electrodes 106 extending in a direction perpendicular to the extending direction of the cathode electrodes are sequentially stacked on a transparent substrate 102 consisting of a glass or synthetic resin material. Each anode electrode 106 is a thin film having a thickness of 50 nm to 150 nm and consisting of ITO ($In_2O_3$—$SnO_2$) or IXO ($In_2O_3$—ZnO) exhibiting a transmittance of 70% or more with respect to ultraviolet light and visible light and having a sheet resistance of 50Ω or less. Each cathode electrode 103 is a thin film having a thickness of 50 nm to 500 nm and consisting of a material having a small work function value for a high electron injection efficiency and exhibiting high reflecting properties with respect to light in the wavelength range of 200 nm to 830 nm, such as magnesium (Mg) or a magnesium based alloy (MgIn or MgAg).

A predetermined voltage is applied between the cathode electrodes 103 and the anode electrodes 106 to inject electrons and holes into the layers 104 and 105. As a result, the intersections between the anode electrodes 106 and the cathode electrodes 103 become emission areas for signal light.

The luminescent layer 105 is made of a mixture of PVCz as a binder/hole transport material and BND. PVCz itself has a hole transport property. It is difficult to form a film by using only BND and a luminescent material. PVCz functions as a binder for binding these compounds. BND is mixed at a molar ratio of about 17/100 with respect to the VCz unit. BND has a relative band gap that encourages injection of electrons into the luminescent layer 105 and injection/transport of holes into the luminescent layer 105. Since the luminescent layer 105 as a single layer having a thickness of 20 nm to 100 nm, more preferably 65 nm to 80 nm, is formed to be adjacent to the anode electrode 106, holes are directly injected from the anode electrode 106 into the luminescent layer 105. The electron transport layer 104 is a single layer consisting of Alq3 and serves to inject electrons into the luminescent layer 105.

A selection signal voltage is sequentially applied to the anode electrodes 106 in units of lines, and emission signal voltages corresponding to display data are simultaneously applied to the cathode electrodes 103 in synchronism with the selection signal voltage. Each selected line emits signal light based on electroluminescence (EL), as indicated by the dotted line in FIG. 11, upon recombination of electrons and holes. In the organic EL element having the above structure, gradation control for the emission luminance based on signal light can be performed in accordance with the voltage applied between the electrodes 103 and 106. In addition, if a plurality of types of luminescent materials for emitting light in arbitrary wavelength ranges are added in the carrier transport layers or the carrier transport layer corresponding to the respective pixels, signal light in arbitrary wavelength ranges can be emitted.

Figure 12:
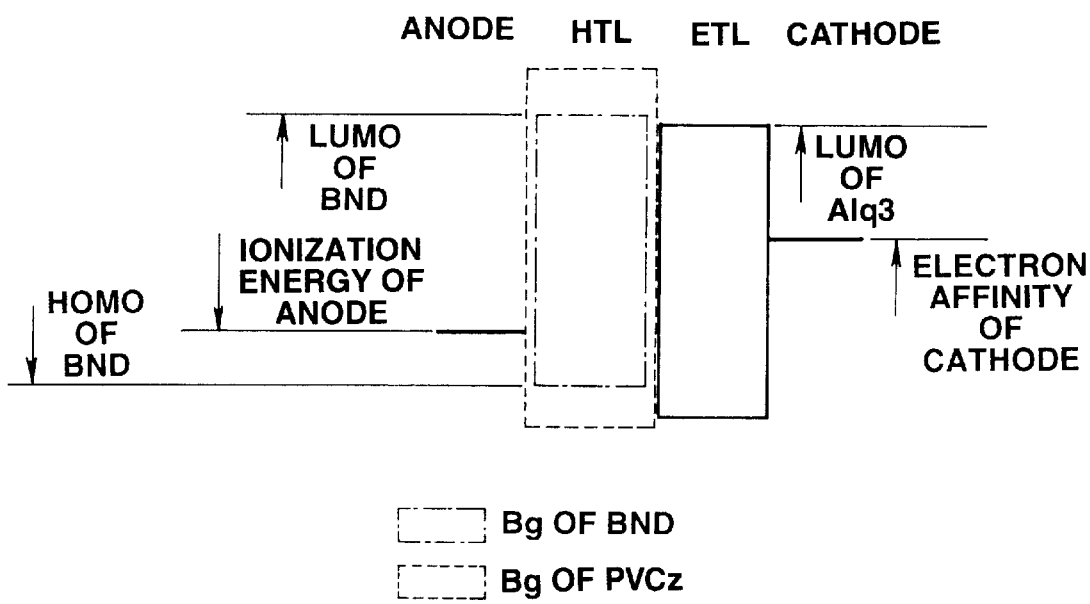
FIG. 12 is a view showing the energy diagram of an organic EL element for signal light.

FIG. 12 shows a luminescence process of an addressing organic EL element having a two-layer structure constituted by a luminescent layer consisting of PVCz and BND and an electron transport layer consisting of Alq3.

In this case, the mobility of electrons in the organic carrier transport layer depends on the LUMO of each material, whereas the mobility of holes depends on the HOMO of each material. In other words, the movement of these particles having charges reflects the upper and lower limits of the intrinsic band gap of each material. From the viewpoint of the entire structure including the electrodes, the behavior of electrons reflects the electron affinity (eV) of each material, whereas the behavior of holes reflects the ionization energy (eV) of each material.

There is a potential barrier between the electron affinity of the cathode and the LUMO of Alq3. However, by applying a predetermined voltage between the cathode and the anode, electrons can hop the potential barrier to be injected from the cathode electrode and the ETL. There is a potential barrier between the ionization energy of the anode and the HOMO of the HTL. However, by applying a voltage between the cathode and the anode, holes can hop the potential barrier to be injected from the anode electrode to the HTL.

As for the movement of holes in the HTL, hopping conduction dominates; the holes hop around the trapping sites formed in the mixture of PVCz and BND. More specifically, the holes which hop a gap A between the ionization energy of the anode and the HOMO of BND upon application of a voltage sequentially hop a gap B between the HOMO of BND and the HOMO of PVCz and move toward the ETL. The electrons injected into Alq3 hop a gap E upon application of a voltage. However, since a gap D is large, most of the electrons stay near the interface between the HTL and the ETL to recombine with the holes transported in the HTL. As a result, light in the wavelength range of 350 nm to 600 nm is emitted. This light emission is substantially light emission from PVCz.

Figure 13:
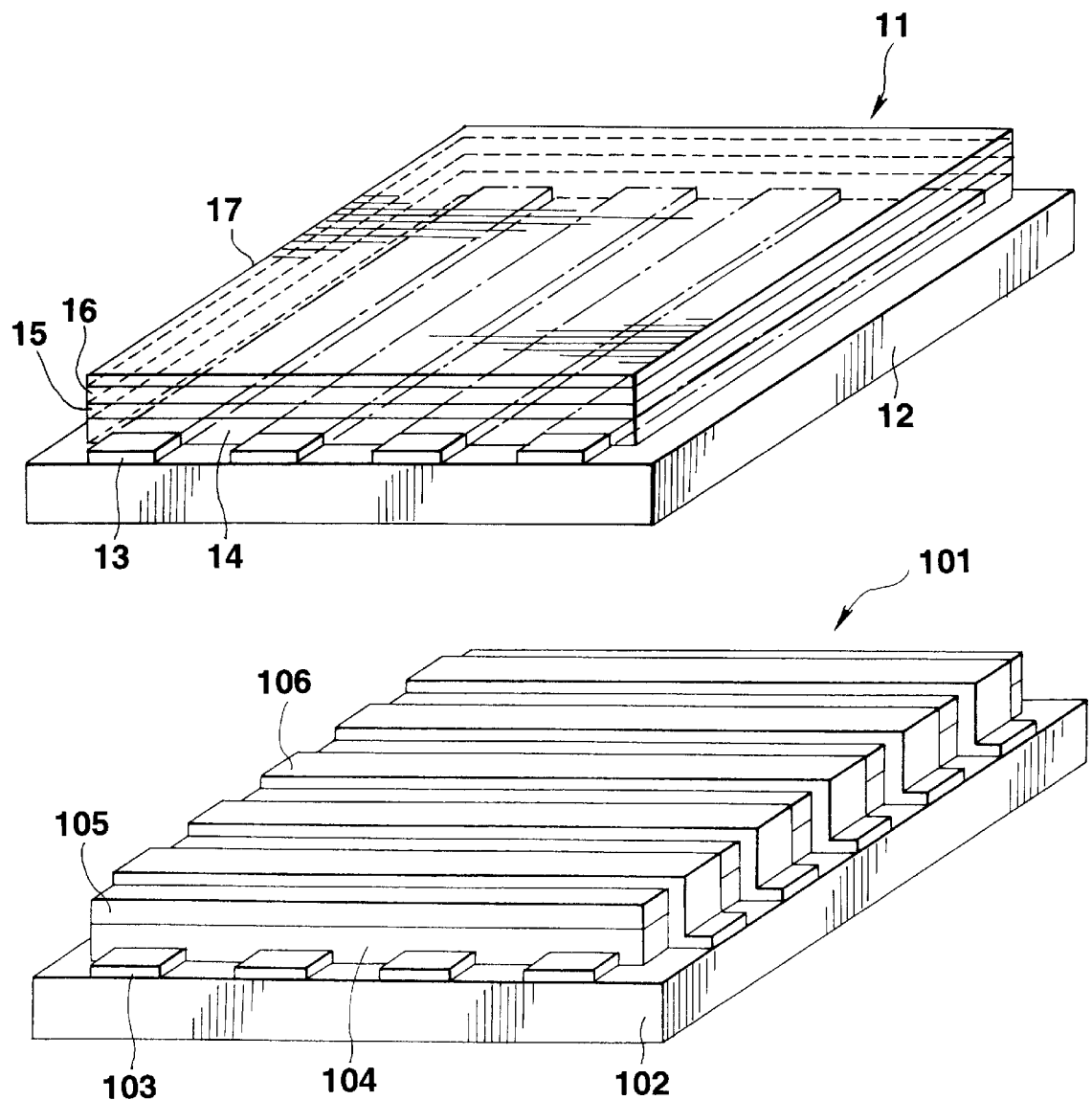
FIG. 13 is a perspective view showing the three-dimensional arrangement of the organic EL element for display light and the organic EL element for signal light according to the present invention.

FIG. 13 shows the arrangement of the display organic EL element 11, together with the arrangement of the addressing organic EL element 101 adjacent to the organic EL element 11. The cathode electrodes 13 of the display organic EL element 11 correspond to the cathode electrodes 103 of the addressing organic EL element 101. These electrodes 13 and 103 have almost the same shape, are equal in number, and are arranged in the same direction to oppose each other. Signal light from the organic EL element 101 is sequentially incident on corresponding areas of the photoconductive layer 14. As a result, the luminescent layer 16 emits light at a luminance corresponding to the signal light.

Figure 14:
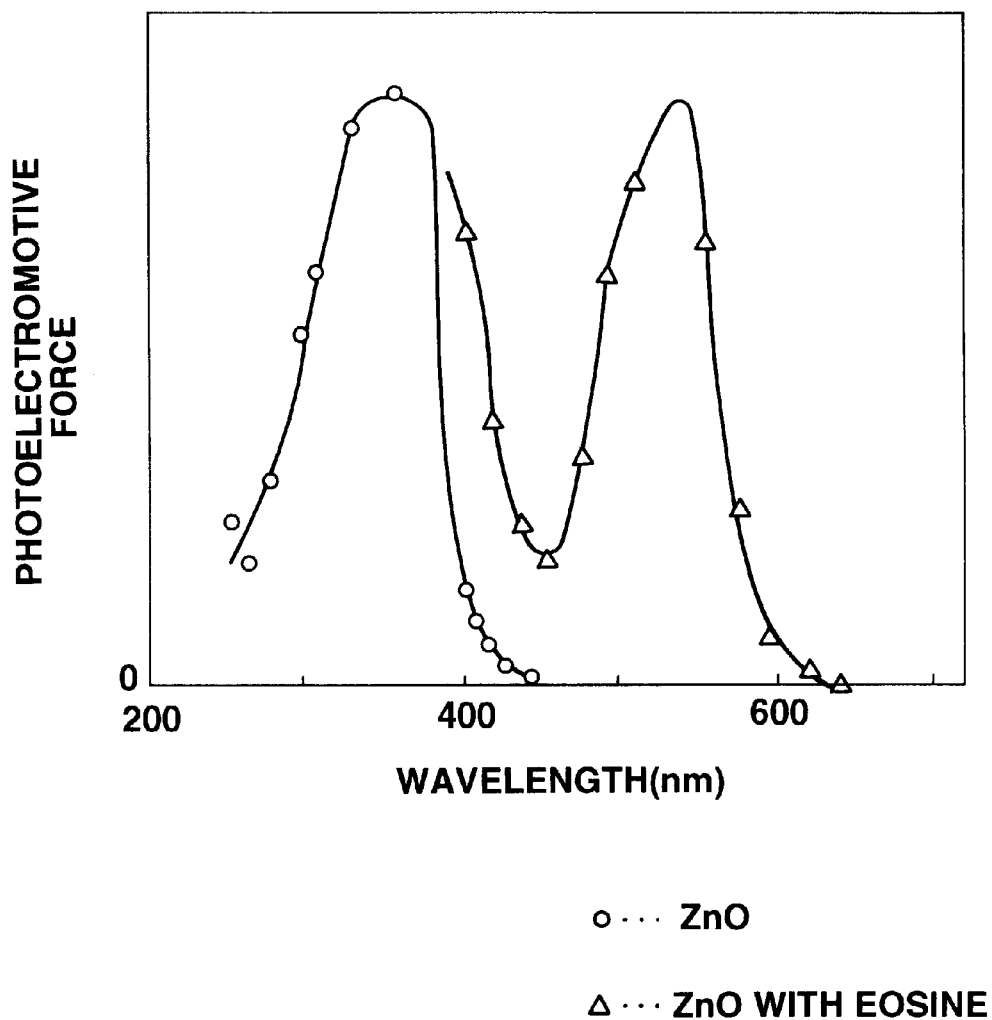
FIG. 14 is a graph showing the photoconductive characteristics of a photoconductive layer containing zinc oxide.

The photoconductive layer 14 consists of zinc oxide (ZnO) containing eosine as a sensitizer. As shown in FIG. 14, when light having a wavelength of 650 nm or less is irradiated on the photoconductive layer 14, a photoelectromotive force is generated.

The following is the chemical formula of eosine:

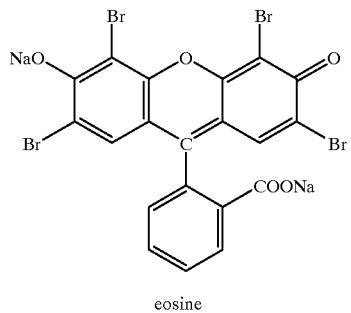

eosine

Figure 15:
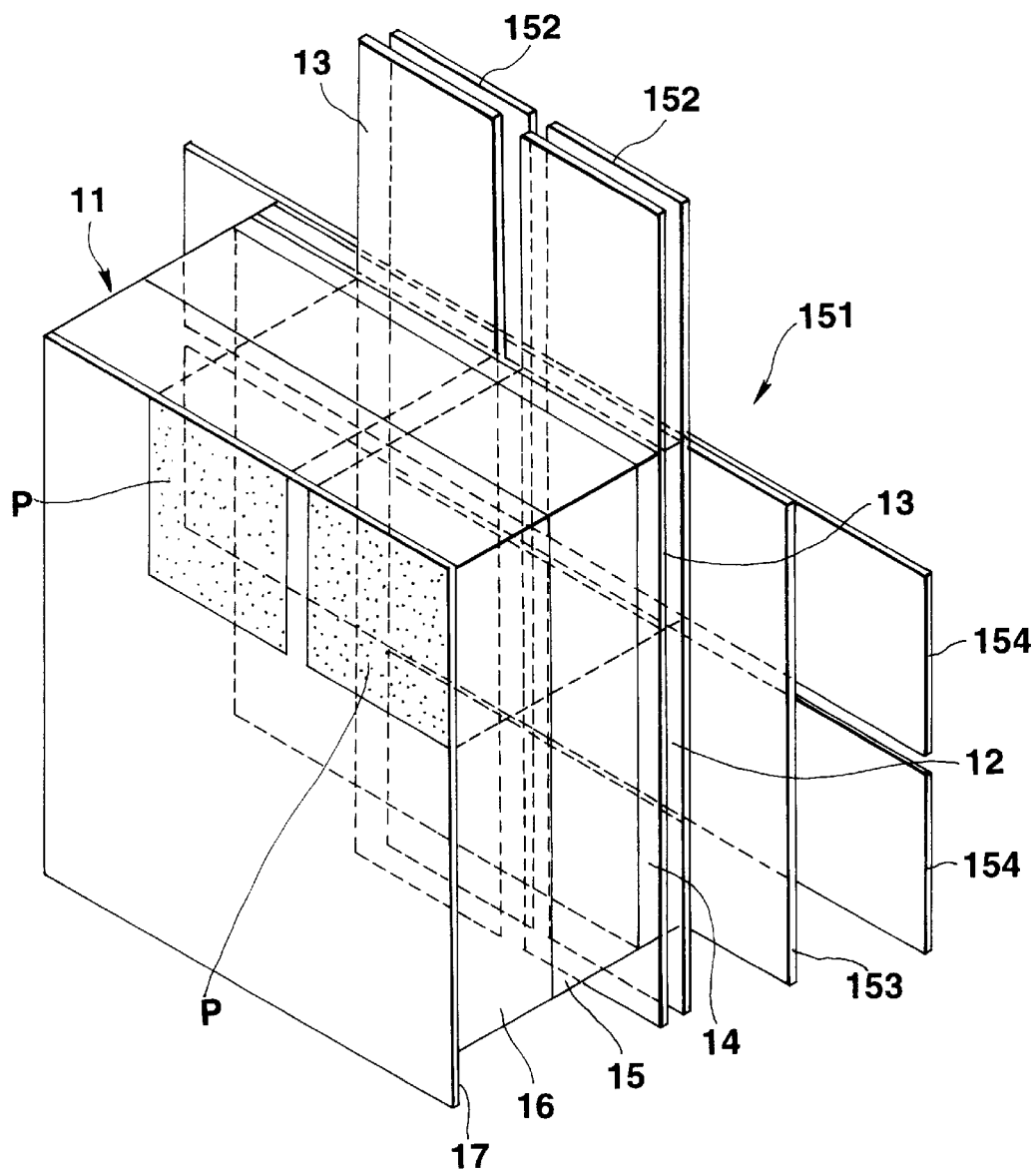
FIG. 15 is a perspective view showing the organic EL element for display light and the organic EL element for signal light according to the present invention.

FIG. 15 shows a display device incorporating a display organic EL element for emitting display light and an addressing organic EL element for emitting signal light.

A display organic EL element 11 constituted by a plurality of striped cathode electrodes 13, a photoconductive layer 14, an electron transport layer 15, a luminescent layer 16 also serving as a hole transport layer, and an anode electrode 17 is formed one surface of a substrate 12. The photoconductive layer 14 consists of zinc oxide containing eosine as a sensitizer.

Row electrodes 152 having the same shape as that of the cathode electrodes 13 and equal in number thereto are formed on the other surface of the substrate 12. A luminescent layer 153 is formed to cover the upper surfaces of the row electrodes 152. A plurality of column electrodes 154 are formed on the upper surface of the luminescent layer 153 in a direction perpendicular to the extending direction of the row electrode 152. Each row electrode 152 is formed by a thin film having a thickness of 50 to 150 nm and consisting of ITO ($In_2O_3$—$SnO_2$) or IXO ($In_2O_3$—$ZnO$) having a sheet resistance of 50Ω or less and exhibiting high transparency with respect to light in the wavelength range of 200 nm to 830 nm. Each column electrode 154 is formed by a thin film having a thickness of 50 nm to 500 nm and consisting of a material having a small work function value for a high electron injection efficiency and exhibiting high reflecting properties with respect to light in the wavelength range of 200 nm to 830 nm, such as magnesium (Mg) or a magnesium based alloy (MgIn or MgAg). The luminescent layer 153 is constituted by a hole transport layer 161 consisting of PVCz and BND and facing the row electrodes 152 and an electron transport layer 162 consisting of Alq3 and facing the column electrodes 154. Emission areas P of the display organic EL element 11 substantially correspond to the intersections between the row electrodes 152 and the column electrodes 154.

Figure 16:
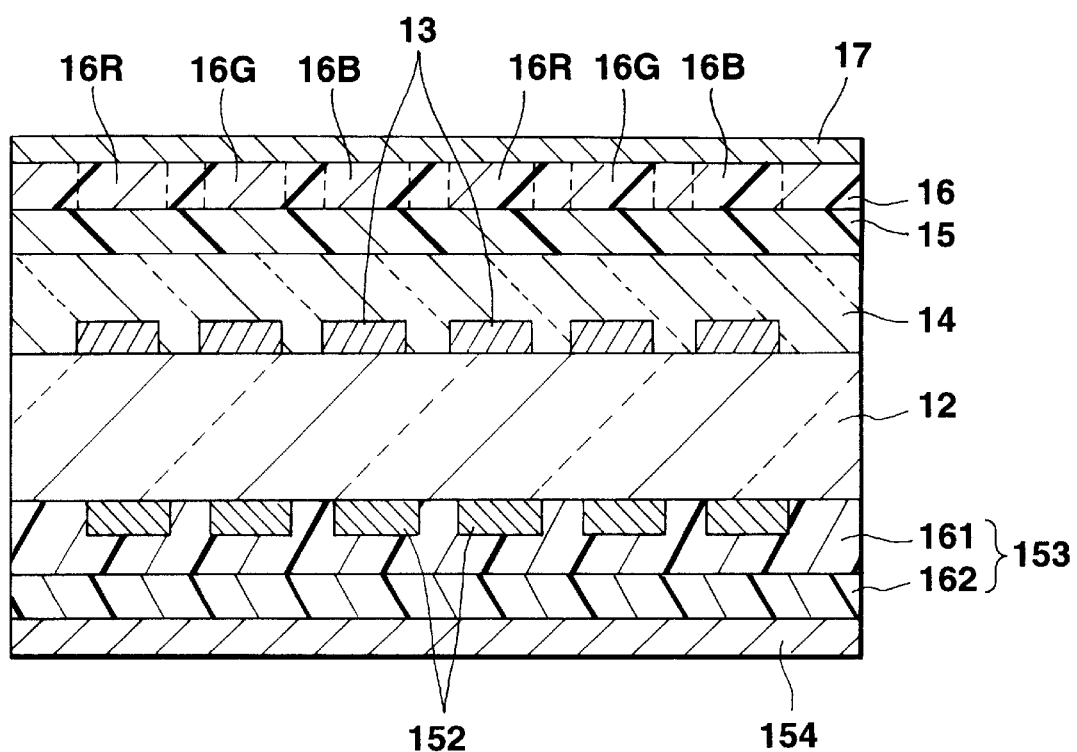
FIG. 16 is a sectional view showing the organic EL element for display light and the organic EL element for signal light which are mounted on one substrate.

FIG. 16 is a cross-sectional view of the display device in FIG. 15. Each emission area of the luminescent layer 16 is divided into areas 16R, 16G, and 16B which respectively emit red light, green light, and blue light in accordance with injection of carriers.

Figure 17:
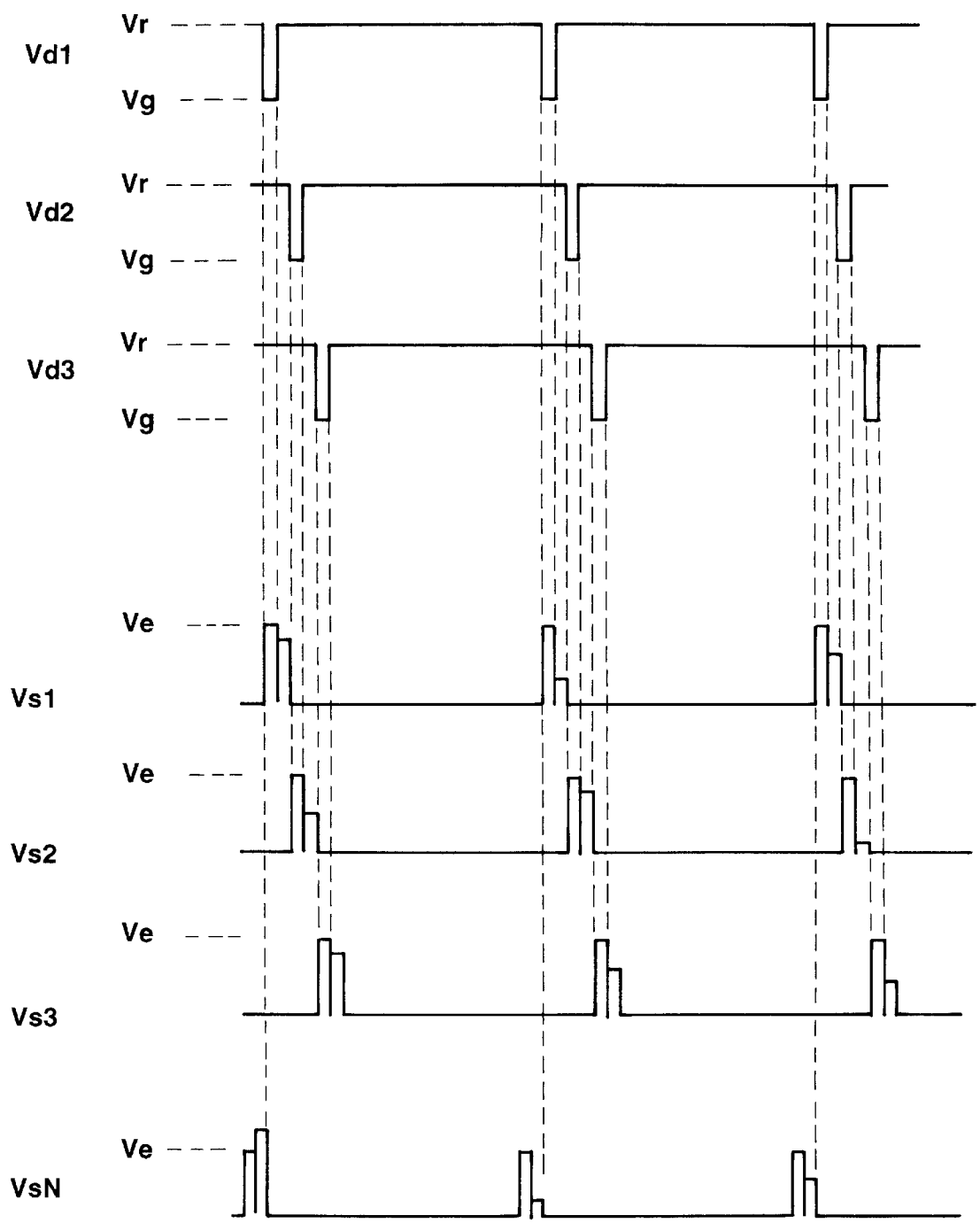
FIG. 17 is a timing chart showing drive waveforms applied to the organic EL element for display light and the organic EL element for signal light according to the present invention.

FIG. 17 is a timing chart of the display device. Referring to FIG. 17, reference symbols Vd1, Vd2, and Vd3 denote the waveforms of drive voltages applied between the adjacent cathode electrodes that is, first, second and third electrodes 13 and the anode electrode 17 of the display organic EL element 11, and pulse trains for 1 scanning line selection period determined by line-sequential driving for the row and column electrodes 152 and 154. Each of these waveforms Vd1, Vd2, and Vd3 corresponds to first to third electrodes of N cathode electrodes 13, and is constituted by HI potential and LOW potential to be applied during 1 scan period which is divided into at least two periods (need not be divided into equal periods). In this case, LOW potential is a potential to be applied during the erase period, and HI potential is a potential to be applied during the write period corresponding to 1 frame period, the erase period excluded. More specifically, an erase voltage Vg or the ground potential is applied during the erase period, whereas a write voltage Vr having a predetermined voltage value is applied during the write period. The erase period is preferably set immediately before the selected write period.

Referring to FIG. 17, reference symbols Vs1, Vs2, Vs3, . . . , VsN denote voltage pulses, each used to emit signal light corresponding to an arbitrary dot portion on a corresponding one of the first select line, the second select line, the third select line, . . . , the Nth select line of the N lines of the row electrodes 152 of an X-Y matrix constituted by the row electrodes 152 and the column electrodes 154 which are line-sequentially driven. A predetermined scanning voltage is applied to the row electrode 152 as a select line, and signal voltages corresponding to luminances at which the emission areas P corresponding to the respective dot portions are caused to emit light are applied to the column electrodes 154. As a result, the respective dots of the select line emit signal light at the luminances corresponding to the signal voltages.

Figure 18:
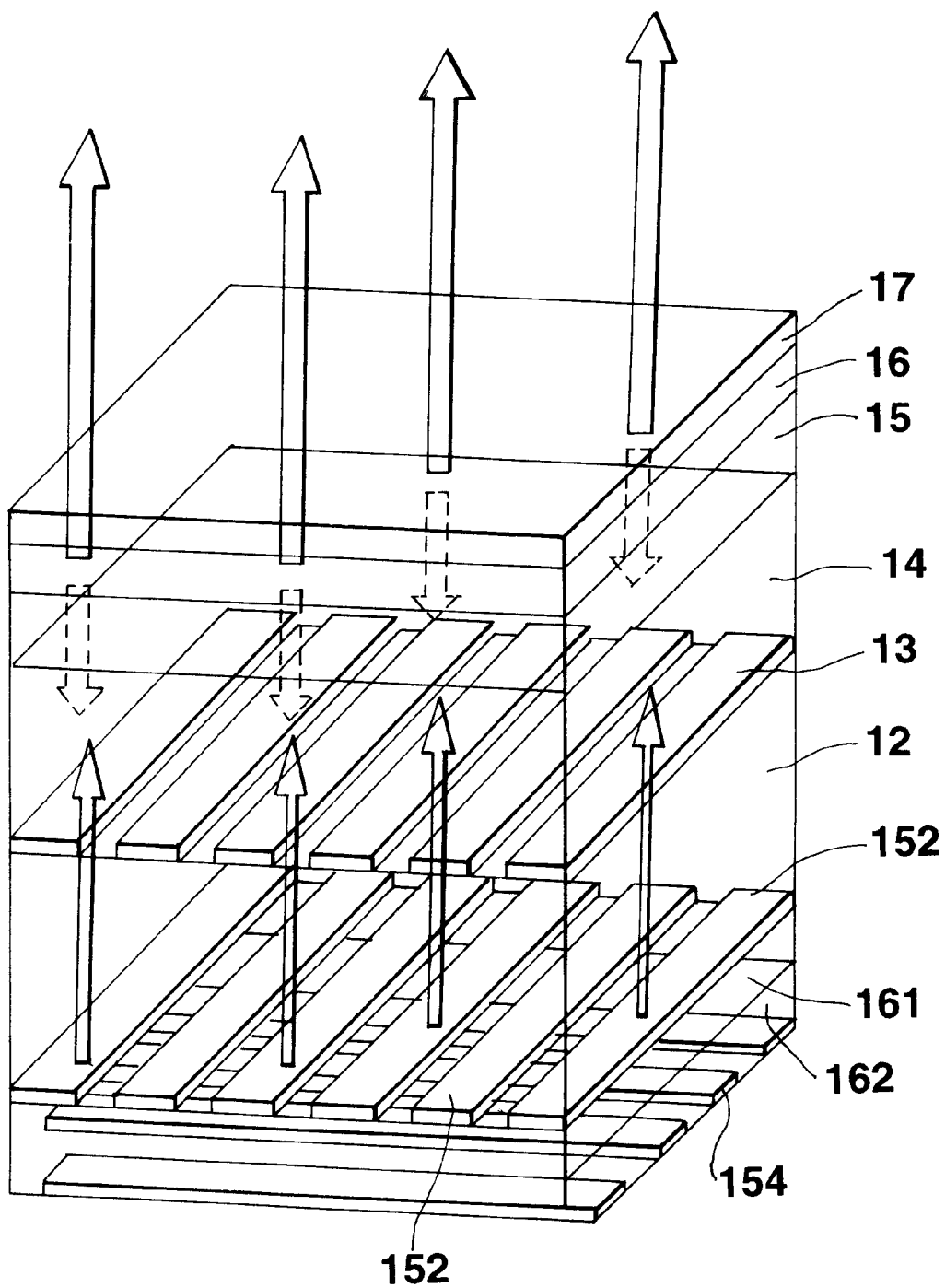
FIG. 18 is a perspective view for explaining the memory function of a display device of the present invention.

First of all, an erase voltage Ve having a constant voltage value is applied during the address erase period for the first select line to cause the entire portion, of the luminescent layer 153, on the first select line to emit erase signal light. As shown in FIG. 18, the erase signal light reaches the photoconductive layer 14 through the substrate 12 to generate electron-hole pairs in the photoconductive layer 14, thereby injecting electrons in the direction of thickness of the photoconductive layer 14. At this time, since the potential between the cathode electrode 13 and the anode electrode 17 at the position corresponding to the first select line is set to the ground voltage Vg, the carriers stored in the luminescent layer 16, the electron transport layer 15, and the photoconductive layer 14, which have been stored in the previous selection period, are refreshed.

Write voltages corresponding to the respective emission areas P corresponding to the first select line are applied during the address write period to cause the luminescent layer 153 to emit write signal light. Carriers are then generated in the photoconductive layer 14 in a quantity corresponding to the irradiated write signal light. These carriers behave in the same manner as shown in FIGS. 3, 4, and 5. More specifically, the electrons generated in the photoconductive layer 14 by the signal light are injected into the electron transport layer 15 upon application of the voltage Vr. The generated holes are stored on the interface between the electron transport layer 15 and the cathode electrode 13. Electrons are injected into the electron transport layer 15 in a quantity corresponding to the write signal light, and holes are injected from the anode electrode 17 to the luminescent layer 16 to cause recombination. As a result, the emission areas P corresponding to predetermined dots emit display light at luminances corresponding to the write signal light.

Although the signal light is quickly quenched in the luminescent layer 153, the carriers generated in the photoconductive layer 14 are stored for 1 frame period. Since electrons are continuously injected owing to the write voltage Vr during this period, emission of display light continues. As described above, even if signal light is weak enough to prevent crosstalk, the photoconductive layer 14 holds carriers to allow only areas in which the carriers are stored during the write period to irradiate display light.

Furthermore, upon emission of light from the luminescent layer 16, display light colored by the respective luminescent materials is generated forward. At the same time, as shown in FIG. 18, return light indicated by the dotted arrows is generated backward. If the return light is set to light in the wavelength range that generates carriers in the photoconductive layer 14, the incident return light re-excites the photoconductive layer 14 to generate new electron-hole pairs. The photoconductive layer 14 is therefore kept in the state that allows injection of electrons into the electron transport layer 15 using carriers generated upon re-excitation. For this reason, while a drive voltage is kept applied to the luminescent layer 16, electrons are kept injected into the electron transport layer 15. In this state, the luminescent layer 16 continues to emit display light even if selected period of the row and column electrodes 152 and 154 are passed. Therefore, by line-sequential scanning, stable emission of display light can be sustained until the next scan period.

If the substrate 12 is made of a synthetic resin, since the substrate may be thin as about 0.1 mm to 0.2 mm, attenuation of signal light can be suppressed. In addition, the radiatively emitted signal light can be prevented from scattering and entering areas, of the photoconductive layer 14, which correspond to dots adjacent to the intended dots, thus preventing an operation error.

Figure 19:
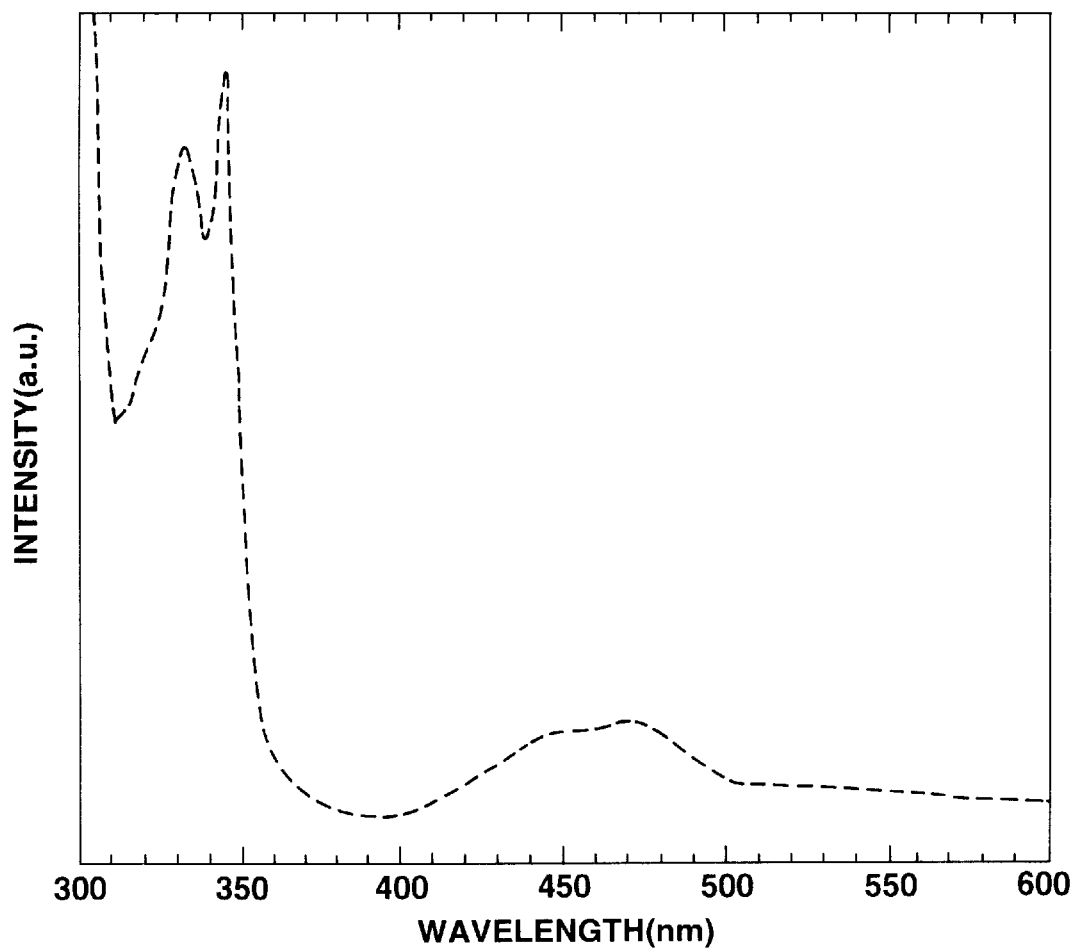
FIG. 19 is a graph showing the light absorption spectrum of PVCz.

Since PVCz doped with coumarin 6 absorbs light with characteristics as shown in FIG. 19, the luminescent layer 16 which receives signal light may be designed to emit display light by using an electric luminescent property of emitting display light upon injection of carriers from the electrodes 13 and 17 and a photoluminescent property of emitting display light by directly absorbing signal light.

In this embodiment, as described above, since display light emission is sustained until the next line-sequential scanning operation, high-quality display can be performed. In addition, since the organic EL element for emitting display light and the organic EL element for emitting signal light are respectively formed on the opposing surfaces of the substrate 12, reductions in the profile and weight of the display device can be realized, together with its simplification. According to the conventional organic EL element, in high-duty matrix drive, since each pixel must hold light emission for 1 frame period, a very high initial voltage must be set. This shortens the life of the EL display element itself. According to this embodiment, however, a good memory function or proper hysteresis based on return light can be realized for each pixel with a simple structure without using switching elements typified by TFTs or elements having memory functions such as ferroelectric liquid crystal elements, thereby realizing high-quality display under a high-duty drive condition. For the same reason, the maximum instantaneous voltage required for the EL display element to obtain a desired display luminance can be decreased, and hence a longer life of the EL display element can be performed. In addition, since a low-luminance area in which the luminous efficacy of the organic EL element is maximized can be used, the overall power consumption of the element can be reduced. Furthermore, in this embodiment, since a multi-segment structure is formed on the single substrate 12, the yield is high. This structure is also advantageous in realizing a large-screen element from the viewpoint of manufacture as compared with TFT displays, ferroelectric liquid crystal displays, and plasma displays. This embodiment is also free from a decrease in opening ratio caused when TFTs and bus lines block light, which problem needs to be considered in display devices using TFTs. For this reason, this organic EL element is superior to TFT drive display elements in display luminance and luminous efficacy. Moreover, patterning and alignment techniques for this structure are much easier than those in the TFT manufacturing process, and the film formation step can be performed at a relatively low temperature.

In the first embodiment, a layer made of a mixture of PVCz, BND and a luminescent material is used as a luminescent layer. Considering the mobility of holes, a luminescent layer may be made of a mixture of PVCz, BND, a luminescent material and N,N'-diphenyl-N,N'-bis(3-methyl)-1,1'-biphenyl-4,4'-diamine as a triphenyldiamine derivative (to be referred to as TPD hereinafter) to make the trapping sites formed in the mixture of PVCz and BND smaller. The following is the chemical formula of this compound:

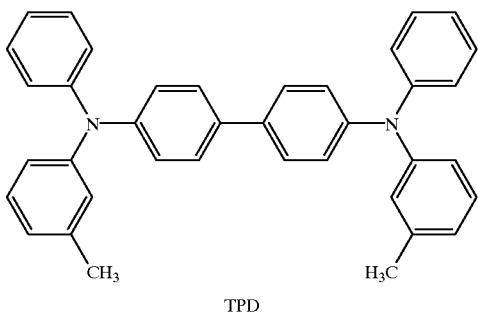

TPD

Figure 20:
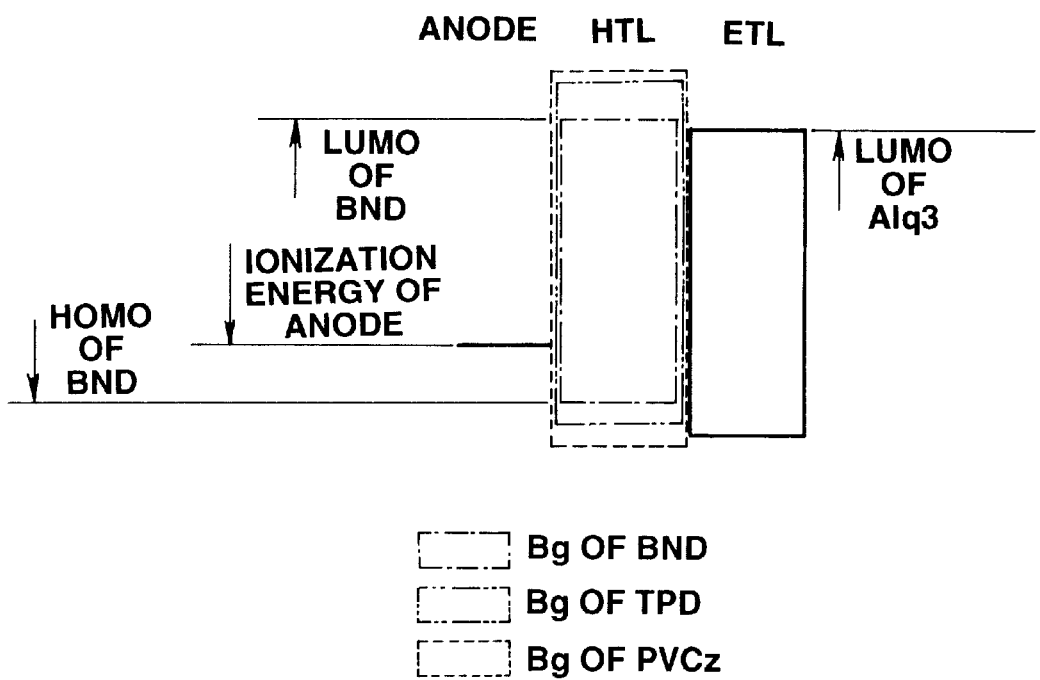
FIG. 20 is a view showing the energy diagram of an HTL containing BND, TPD, and PVCz.

FIG. 20 shows the energy diagram of the organic EL element having the above structure. TPD has a band gap that reduces the gap B shown in FIG. 6. That is, since the HOMO of TPD is between the HOMO of BND and the HOMO of PVCz, the mobility of holes moving toward the ETL side in the HTL improves, and hence the luminous efficacy improves.

In this embodiment, a mixture of PVCz and BND is used as a hole transport material. However, for example, PVCz alone may be used, or 4,4',4"-tris(3-methylphenylphenylamino)triphenylamine(MTDATA) may be used. The following is the chemical formula of MTDATA:

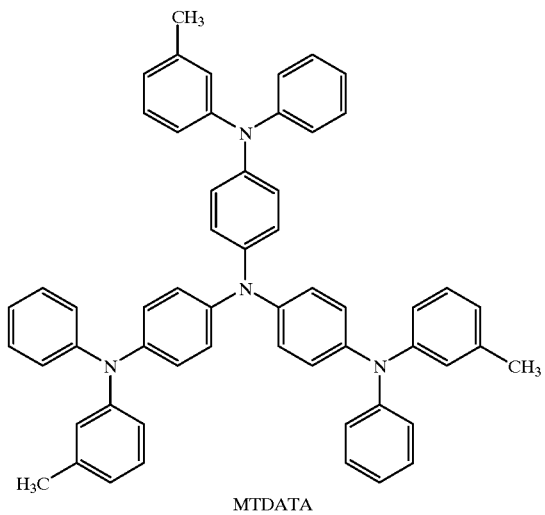

MTDATA

In addition, a protective insulating film may be formed on the upper surface of the anode electrode 17, and a light-shielding film on the protective insulating film for shielding an external light irradiating from outside of the display device containing a light in a wavelength range generates carriers in the photoconductive layer 14. If ultraviolet light is used as signal light, and an anti-ultraviolet film is formed, display light is not absorbed by the light-shielding film throughout the visible range, thus performing proper display.

(Second Embodiment)

Figure 21:
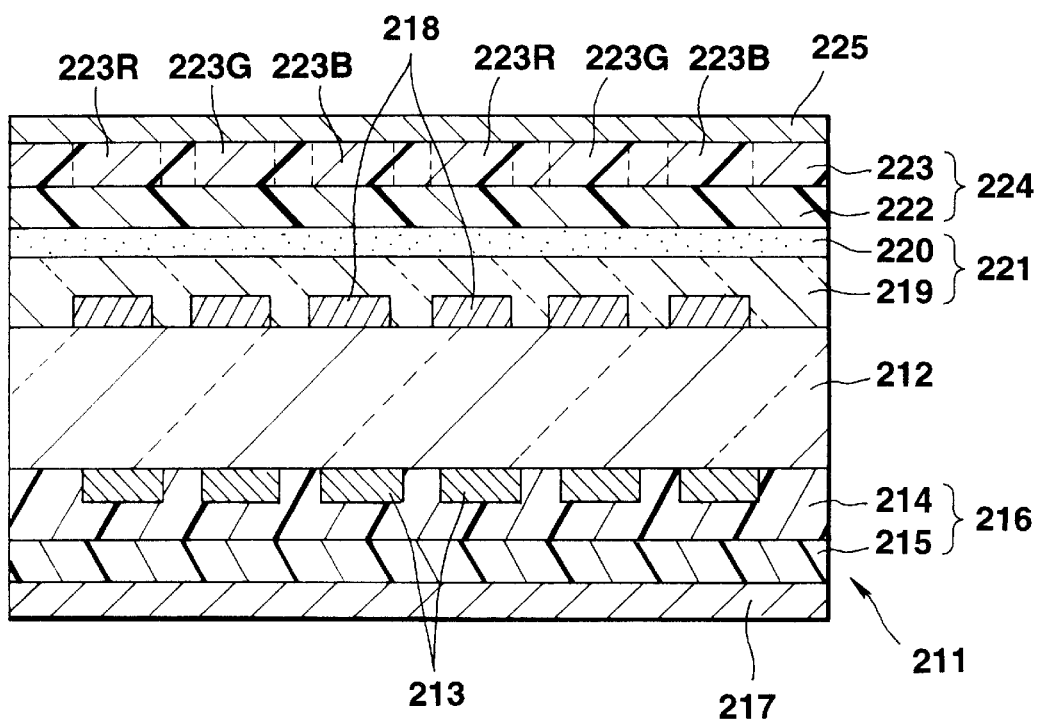
FIG. 21 is a sectional view showing a display device according to the second embodiment of the present invention, in which an a-Si layer and a doped layer are used for a photoconductive layer.

FIG. 21 shows the second embodiment of the present invention. Referring to FIG. 21, reference numeral 211 denotes a display device. The display device 211 is mainly constituted by an organic EL element for address signal light and an organic EL element for display light. The organic EL element for address signal light is formed by arranging a plurality of row electrodes 213 as first electrodes on the lower surface of a substrate 212 consisting of an electrically insulating glass material or a flexible polymer film exhibiting high transparency with respect to light in the wavelength range of 200 nm to 830 nm to extend in the row direction as the first direction. The row electrodes 213 serve as anode electrodes. Each row electrode 213 may consist of an electrode material exhibiting high transparency with respect to light in the wavelength range of 200 nm to 830 nm and having a predetermined work function. For example, ITO or IXO can be used. A first organic film 214 substantially serving as a luminescent layer and also serving as a hole transport layer is formed on the lower surfaces of the row electrodes 213 and the substrate 212. The first organic film 214 is made of a mixture of PVCz, BND and a luminescent material containing R. G, and B phosphors to emit white light in accordance with injected carriers. A second organic film 215 serving as an electron transport layer and consisting of Alq3 is formed on the lower surface of the first organic film 214. The first organic film 214 and the second organic film 215 constitute a signal light luminescent layer 216.

A plurality of column electrodes 217 are formed on the lower surface of the second organic film 215 to extend in the column direction perpendicular to the row direction and cross the row electrodes 213 through the signal light luminescent layer 216. The column electrodes 217 serve as cathode electrodes. Each column electrode 217 is a metal electrode consisting of MgIn, AlLi, MgInAl, MgAg, or the like which has a work function smaller than that of each anode electrode and reflects light in the visible and ultraviolet ranges.

In the address light element having the above arrangement, when a predetermined voltage is applied between the row electrode 213 and the column electrode 217, white light as signal light is emitted from a portion near the interface between the first organic film 214 and the second organic film 215. In addition, the row and column electrodes 213 and 217 extend to the edges of the substrate 212 to be connected to drive ICs (not shown). In this manner, a matrix drive address light element is constituted.

The EL display element for display light has a display area almost equal to the entire luminescent area of the organic EL element for signal light. This display light organic EL element is formed on the upper surface side of the substrate 212. A plurality of rear drive electrodes 218 as cathode electrodes, each consisting of a transparent ITO or IXO material, are formed on the upper surface of the substrate 212. The rear drive electrodes 218 are formed/arranged to oppose and overlap the row electrodes 213 when viewed two-dimensionally.

A photoconductive layer 221 is formed on the upper surface of the substrate 212 and the upper surfaces of the rear drive electrodes 218 to cover the entire display area.

This photoconductive layer 221 is constituted by an amorphous silicon (a-Si) layer 219 consisting of a material which absorbs signal light and generates conduction carriers, and a doped layer 220 formed by doping a-Si, formed on the upper surface of the a-Si layer 219, with an n-type impurity (e.g., phosphorus). A third organic layer 222 serving as an electron transport layer and consisting of Alq3 is formed on the doped layer 220. Note that the doped layer 220 has a function of facilitating injection of electrons into the third organic layer 222. A fourth organic layer 223 serving as a hole transport layer is formed on the upper surface of the third organic layer 222. The fourth organic layer 223 is made of PVCz and BND. The respective dot portions (corresponding to portions (emission areas) where the row and column electrodes 213 and 217 of the organic EL element for signal light overlap each other through the signal light luminescent layer 216) of the fourth organic layer 223 contain luminescent materials for emitting R (red) light, G (green) light, and B (blue) light to constitute a predetermined color matrix. Referring to FIG. 21, reference numerals 223R, 223G, and 223B denote the dot portions of the fourth organic layer 223 which correspond to emission of R light, G light, and B light. As a method of forming the fourth organic layer 223, for example, the following methods can be used: a method of applying a mixture of PVCz and BND on the third organic layer 222, and permeating the respective dot portions of the fourth organic layer 223 with corresponding luminescent materials; and a method of patterning an organic film containing luminescent materials in units of colors in accordance with the color matrix. The third organic layer 222 and the fourth organic layer 223 formed in this manner constitute a display light emitting layer 224. A transparent front drive electrode 225 serving as an anode electrode and consisting of ITO is formed on the upper surface of the fourth organic layer 223 to cover the entire display area.

The operation of the display device 211 will be described next.

First of all, in the signal light element, when a predetermined voltage is applied between the row and column electrodes 213 and 217 which are selected by line-sequential scanning, white light as signal light is irradiated from the signal light luminescent layer 216 onto the photoconductive layer 221 through the substrate 212. In this case, since the signal light luminescent layer 216 is sufficiently close to the photoconductive layer 221, the signal light reaches on the photoconductive layer 221 while maintaining a practically sufficient spatial frequency. For this reason, no signal light from a predetermined address is incident on the a-Si layer 219 and the doped layer 220 in a dot area adjacent to a corresponding dot to excite them. As described above, each portion of the photoconductive layer 221 on which the signal light is incident generates electron-hole pairs to be set in a state that allows injection of electrons into the third organic layer 222. With this operation, the voltage applied between the front drive electrode 225 and the rear drive electrode 218 is applied to a predetermined dot portion of the display light emitting layer 224 constituted by the third organic layer 222 and the fourth organic layer 223. Note that a DC drive voltage, a pulse voltage, an AC voltage, or the like can be applied between the drive electrodes. As a result, as described above, when the organic EL element for display light emits light, display light colored by the respective luminescent materials is generated forward, and at the same time, return light is generated toward the organic EL element for signal light. Since this return light is incident on the photoconductive layer 221, the a-Si layer 219 and the doped layer 220 are re-excited to generate new electron-hole pairs. The photoconductive layer 221 therefore maintains the state that allows injection of electrons into the third organic layer 222. For this reason, while a drive voltage is kept applied to the display light emitting layer 224, electrons are continuously injected into the display light emitting layer 224. In this state, the display light emitting layer 224 can be continuously driven for a sufficiently long period of time relative to 1 frame period. Even if, therefore, a select voltage is not applied between the row and column electrodes 213 and 217 of the address signal light element, the display light emitting layer 224 continues its light emission. For this reason, light emission is sustained until the next scanning operation by line-sequential scanning. Note that the voltage applied between the front drive electrode 225 and the rear drive electrode 218 is grounded immediately before the next scanning operation to refresh the carriers stored in the photoconductive layer 221 so as to stop emission of display light, thereby allowing new light emission.

In this embodiment, as described above, since display light emission is sustained until the next line-sequential scanning operation, high-quality display can be performed. In addition, since the organic EL element for signal light and the organic EL element for display light can be formed on one substrate, reductions in the profile and weight of the display device can be attained. According to this embodiment, a good memory function and proper hysteresis based on return light can be realized for each pixel with a simple structure without using switching elements typified by TFTs or elements having memory functions such as ferroelectric liquid crystal elements, thereby realizing high-quality display under a high-duty drive condition.

(Third Embodiment)

Figure 22:
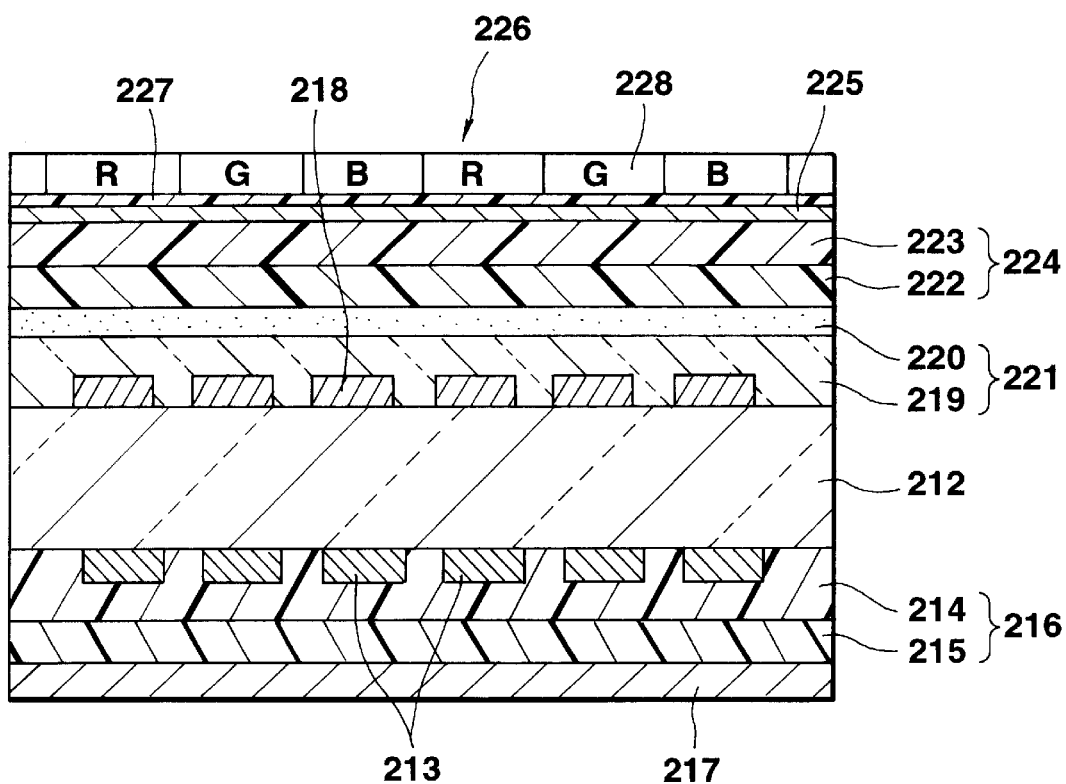
FIG. 22 is a sectional view showing a display device according to the third embodiment of the present invention, to which a color filter is applied.

FIG. 22 is a sectional view showing a display device according to the third embodiment.

A display device 226 of this embodiment includes an RGB color filter 228 and a transparent insulating film 227 which is formed on the upper surface of a front drive electrode 225 of an EL display element for display light. As shown in FIG. 22, the R, G, and B portions of the color filter 228 are arranged according to a predetermined matrix to correspond to the respective dot portions of the EL display element for display light. A fourth organic layer 223 uniformly contains a luminescent material for emitting white light in a wavelength range mixturing the red, green, and blue light wavelength ranges. Note that the remaining arrangement of this embodiment is the same as that of the second embodiment. In this embodiment, of light generated near the interface between the fourth organic layer 223 and a third organic layer 222, return light propagating toward a photoconductive layer 221 is white light. Owing to the effect of the incident return light, electron-hole pairs are newly generated in the photoconductive layer 221 to maintain the state that allows injection of electrons into the third organic layer 222. The white light traveling toward the color filter 228 passes through the color filter 228 to be divided into predetermined color light beams, thereby obtaining display light. In this embodiment, the same function and effect as those of the second embodiment described above can be obtained.

(Fourth Embodiment)

Figure 23:
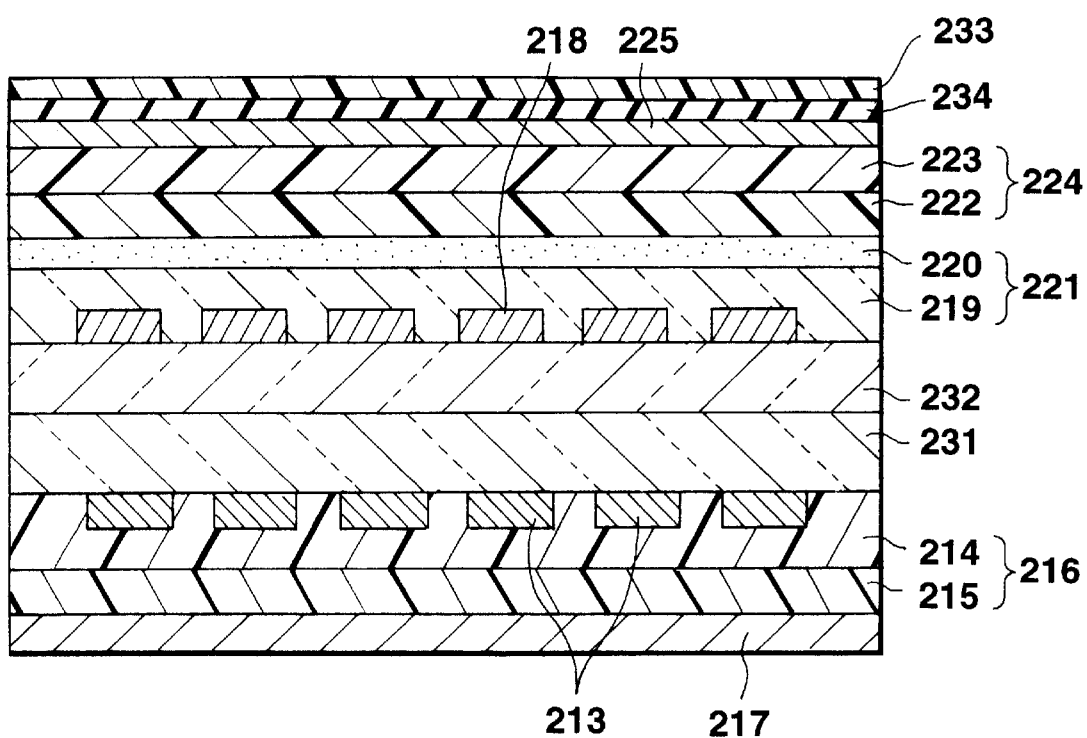
FIG. 23 is a sectional view showing a display device according to the fourth embodiment of the present invention, in which a light-shielding film for blocking incident excitation light is used for a photoconductive layer.

FIG. 23 is a sectional view showing a display device according to the fourth embodiment.

This embodiment is characterized in that an organic EL element for signal light is formed on a substrate 231 made of a glass material or a flexible polymer film, an EL display element for display light is formed on a substrate 232 made of a glass material or a flexible polymer film, and the substrates 231 and 232 are joined to each other. According to this embodiment, by separately forming a signal light element and a display light element, the overall yield can be increased. The remaining arrangement of this embodiment is the same as that of the second embodiment except that an insulating layer 234 formed on the front drive electrode 225 and a light-shielding layer 233 on the insulating layer, for preventing external light generating carriers in the photoconductive layer 221 from being incident on the photoconductive layer 221.

(Fifth Embodiment)

Figure 24:
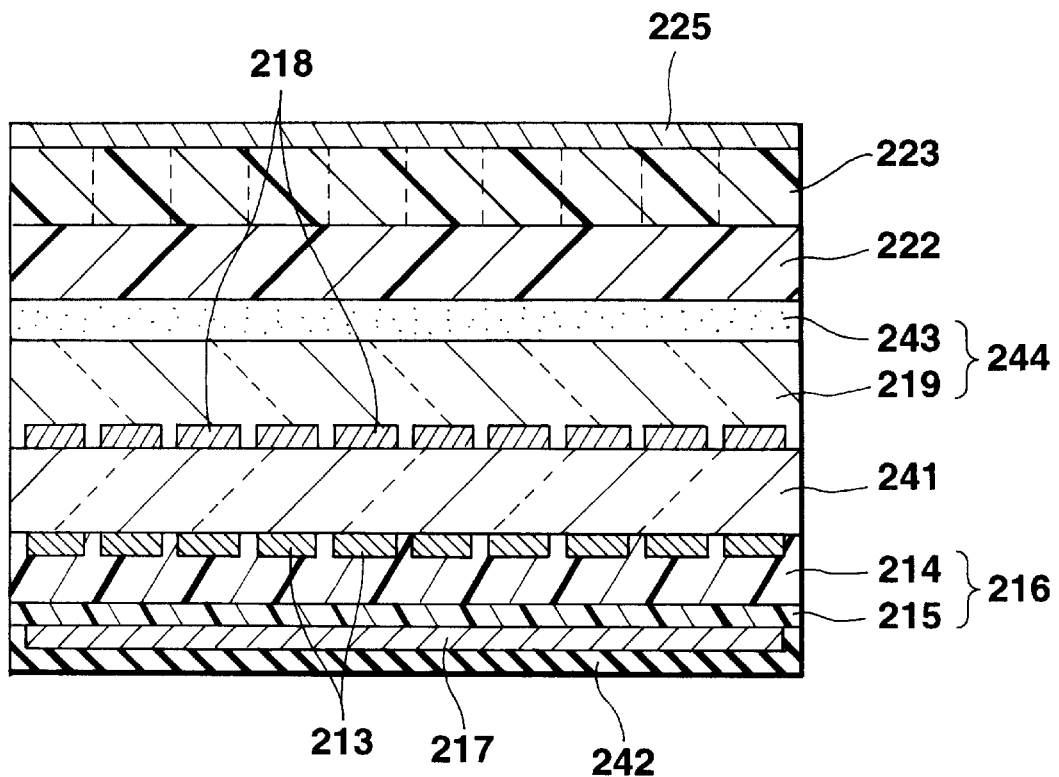
FIG. 24 is a sectional view showing a display device according to the fifth embodiment of the present invention, in which an a-Si layer and an n-type silicon carbide layer are used for a photoconductive layer.

FIG. 24 is a sectional view showing a display device according to the fifth embodiment.

In this embodiment, an organic EL element for signal light is formed on the lower surface side of a substrate 241, and an EL element for display light is formed on the upper surface side of the substrate 241. First of all, row electrodes 213 as anodes are formed on the lower surface of the substrate 241. A first organic film 214 made of a mixture of PVCz, BND and a white luminescent material and a second organic film 215 consisting of Alq3 are sequentially formed on the lower surfaces of the row electrodes 213 and the substrate 241 by vapor deposition.

The first and second organic films 214 and 215 constitute a signal light luminescent layer 216. Striped column electrodes 217 as cathodes are formed on the lower surface of the second organic film 215 to extend in a direction to cross (at right angles) the row electrodes 213. Referring to FIG. 24, reference numeral 242 denotes a protective insulating film formed to cover the column electrodes 217.

Rear drive electrodes 218 as cathodes having the same shape as that of the row electrodes 213 and equal in number thereto are formed on the upper surface of the substrate 241 to oppose the row electrodes 213. A photoconductive layer 244 constituted by an amorphous silicon layer 219 and an electron injection layer 243 consisting of n-type silicon carbide is formed on the upper surfaces of the rear drive electrodes 218 to cover the entire display area. A third organic layer 222 consisting of Alq3 and a fourth organic layer 223 consisting of PVCz, BND and luminescent materials are sequentially stacked on the upper surface of the electron injection layer 243. As the luminescent materials for emitting visible light, R, G, and B phosphors are prepared. These materials are arranged, according to a predetermined color matrix, in the respective dot portions near the interface between the fourth organic layer 223 and the third organic layer 222 to be positioned in those areas of the fourth organic layer 223 where electrons recombine with holes. A transparent front drive electrode 225 consisting of ITO or the like and serving as an anode electrode is formed on the upper surface of the fourth organic layer 223 to cover the entire display area.

(Sixth Embodiment)

Figure 25:
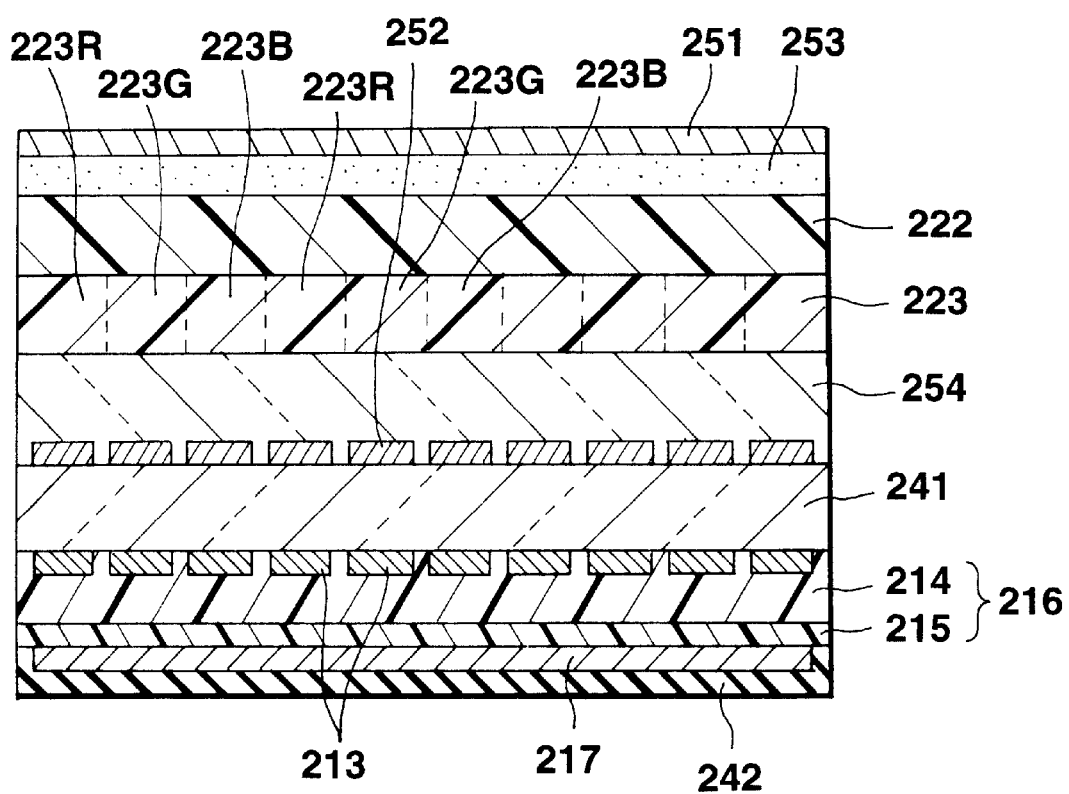
FIG. 25 is a sectional view showing a display device according to the sixth embodiment of the present invention, in which a photoconductive layer is formed to be adjacent to an anode electrode.

FIG. 25 is a sectional view showing a display device according to the sixth embodiment.

This embodiment is characterized in that a front drive electrode 251 and rear drive electrodes 252 are respectively formed as the cathode and anode electrodes of the EL display element for display light, an electron injection layer 253 is joined to the lower surface of the front drive electrode 251, a third organic layer 222 is made of Alq3, and a fourth organic layer 223 is made of PVCz, BND and luminescent materials. A p-type a-Si layer 254 is interposed between the fourth organic layer 223 and the rear drive electrodes 252. In this embodiment, light emission substantially occurs near the interface between the fourth organic layer 223 and the third organic layer 222. At dot portions 223R, 223G, and 223B of the fourth organic layer 223, display light including red light, green light, and blue light, and return light are generated in accordance with the luminescent materials contained in the respective dot portions. The remaining arrangement of this embodiment is the same as that of the fifth embodiment.

(Seventh Embodiment)

Figure 26:
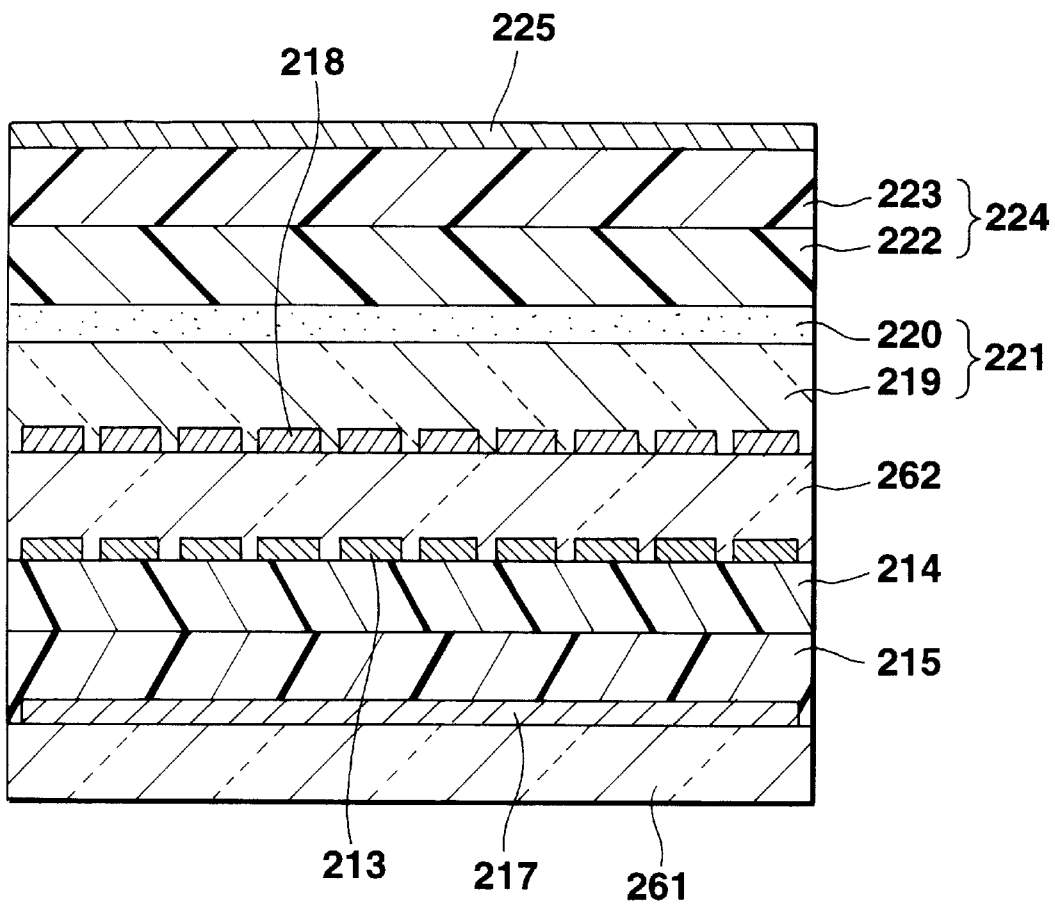
FIG. 26 is a sectional view showing a display device according to the seventh embodiment of the present invention, in which an organic EL element for display light and an organic EL element for signal light are formed on one surface side of one substrate.

FIG. 26 is a sectional view showing a display device according to the seventh embodiment.

This embodiment is characterized in that an organic EL element for signal light and an organic EL element for display light are continuously formed on one substrate 261. Column electrodes 217 are formed on the substrate 261. Thereafter, a second organic film 215, a first organic film 214, and row electrodes 213 are sequentially formed. A protective insulating film 262 is formed on the resultant structure. Similar to the second embodiment, rear drive electrodes 218, a photoconductive layer 221, a third organic layer 222, a fourth organic layer 223, and a front drive electrode 225 are formed on the protective insulating film 262. In this embodiment, simple patterning steps are required to form the column electrodes 217, the row electrodes 213, and the rear drive electrodes 218, but the remaining steps are simple film formation steps. For this reason, this device can be manufactured very easily as compared with a TFT drive display device. In this embodiment, if one of the organic films 222, 223 constituting a display light emitting layer 224 contains luminescent materials at positions corresponding to the respective dot portions or a color filter is formed on the upper surface of the front drive electrode 225, color display can be performed.

(Eighth Embodiment)

Figure 27:
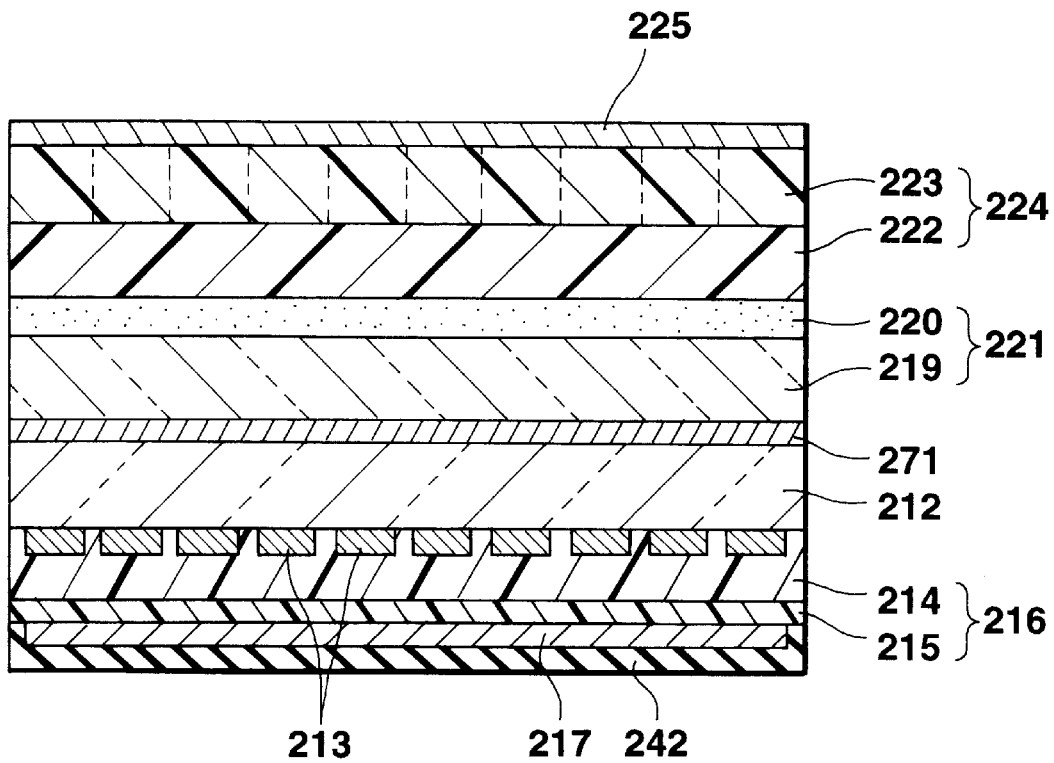
FIG. 27 is a sectional view showing a display device according to the eighth embodiment of the present invention, in which the rear drive electrodes are arranged to be parallel to the column electrodes of an organic EL element for signal light.

FIG. 27 is a sectional view showing a display device according to the eighth embodiment.

In this embodiment, rear drive electrodes 271 are formed to be parallel to column electrodes 217, and the rear drive electrodes 271 have the same shape as that of the column electrode 217 so that the rear drive electrodes 271 are superposed on the column electrodes 217 through a substrate 212, row electrodes 213, and a signal light luminescent layer 216. The remaining arrangement of this embodiment is the same as that of the second embodiment, and the same function and effect as those of the second embodiment can be obtained.

(Ninth Embodiment)

Figure 28:
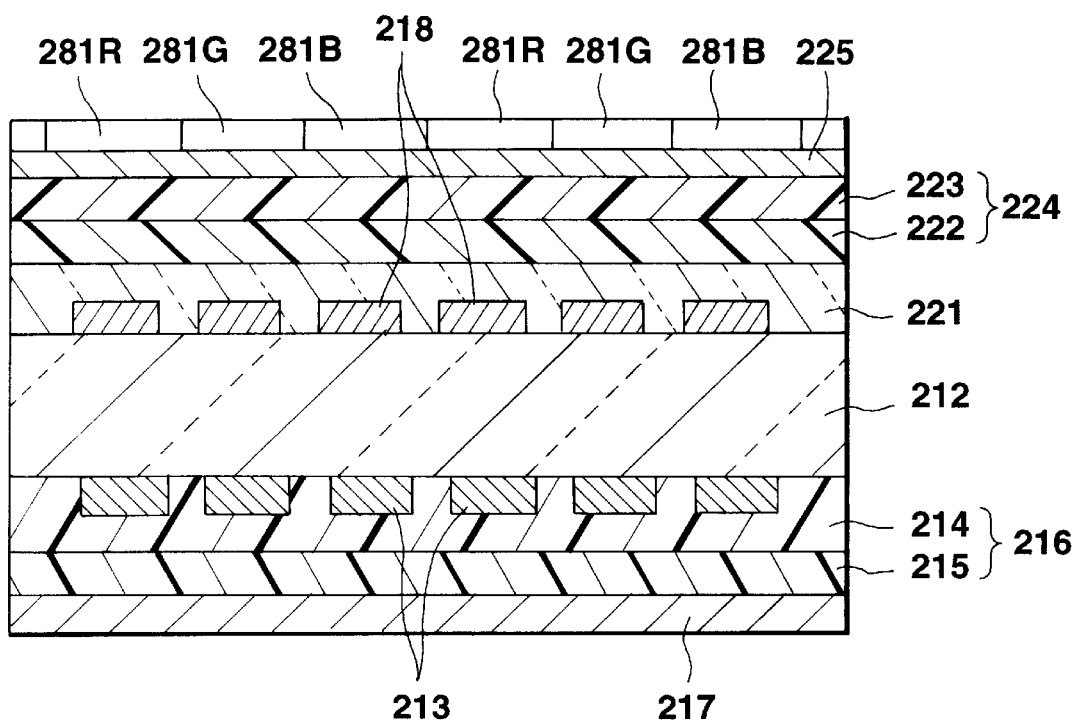
FIG. 28 is a sectional view showing a display device according to the ninth embodiment of the present invention, which has an organic EL element for display light which receives first display light based on signal light and emits light in a wavelength range above the wavelength range of the first display light.

FIG. 28 is a sectional view showing a display device according to the ninth embodiment.

This embodiment is characterized by using display light setting filters 281R, 281G, and 281B, each designed to receive light in a predetermined wavelength range and emit light having a longer wavelength than the received light. As shown in FIG. 28, the display device of this embodiment has a signal light element and a display light element respectively formed on the lower and upper surface sides of a substrate 212. The color filter 228 of the third embodiment in FIG. 22 is designed to receive predetermined light, transmit light components in a given wavelength range, of the received light, and absorb (block) light components in the remaining wavelength ranges. In contrast to this, each of the display light setting filters 281R, 281G, and 281B is designed to receive incident optical energy and emit light in a wavelength range different from that of the incident light. The organic EL element for display light has a fourth organic layer 223 consisting of a mixture of PVCz, BND and a luminescent material for emitting blue light containing ultraviolet light. A photoconductive layer 221 receives signal light from the organic EL element for signal light, and generates carriers. An area of the fourth organic layer 223 which corresponds to that area of the photoconductive layer 221 on which the signal light is irradiated emits first display light. This first display light is irradiated on the display light setting filters 281R, 281G, and 281B. The display light setting filters 281R, 281G, and 281B respectively emit red light, green light, which have longer wavelengths than the first display light, and blue light having a slightly longer wavelength that the first signal light.

In this embodiment, when blue signal light which contains ultraviolet light and is emitted from the organic EL element for signal light enters the photoconductive layer 221, electron-hole pairs are generated in the layer 221, and the layer 221 is set in a state that allows injection of electrons into a display light emitting layer 224 owing to the tunneling effect or the like. For this reason, on the basis of the voltage applied between the rear and front drive electrodes, carriers are injected into a portion of the display light emitting layer 224 which corresponds to that portion of the photoconductive layer 221 on which the signal light is incident, and the portion of the display light emitting layer 224 emits blue light. Assume that signal light is weak. Even in this case, it suffices if carriers are stored in the photoconductive layer 221 to such a degree that injection of carriers from the rear and front drive electrodes into the display light emitting layer 224 can be sustained for 1 frame period.

When blue light is emitted in this manner, the blue light is incident, as return light, onto a portion of the photoconductive layer 221 which corresponds to the portion which has emitted light. The photoconductive layer 221 is then re-excited by the return light to generate new electron-hole pairs. The photoconductive layer 221 therefore sustains the state that allows injection of electrons. For this reason, carriers are kept injected into this portion of the display light emitting layer 224 during a selection period by the drive voltage. In this state, since a display drive operation can be continued for a sufficiently long period of time relative to 1 frame period, even if row and column electrodes 213 and 217 of the signal light element are set in the non-selected state, emission of light from the display light emitting layer 224 is sustained. Since the first display light from the display light emitting layer 224 is held for 1 frame period, the display light setting filters 281R, 281G, and 281B can keep emitting display light for 1 frame period.

For this reason, since high-duty drive can be performed without increasing the maximum instantaneous luminance, the load on the display light emitting layer 224 can be reduced, and the life of the element can be prolonged. In each embodiment, if the substrate 212 is a synthetic resin substrate having a thickness of about 0.1 mm, signal light can be effectively transmitted.

In each embodiment described above, as the photoconductive layer, an a-Si layer or a multilayered structure constituted by an a-Si layer and a doped layer is used. However, zinc oxide, zinc oxide containing eosine, or a naphthalene derivative such as naphthalene-1,4,5,8-tetracarboxylicdianhydride (NTCDA) or Me-PTC may be used for the photoconductive layer.

The following are the chemical formulae of NTCDA and Me-PTC:

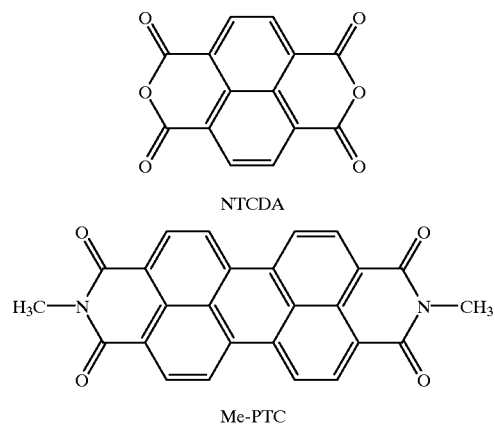

Figure 11:
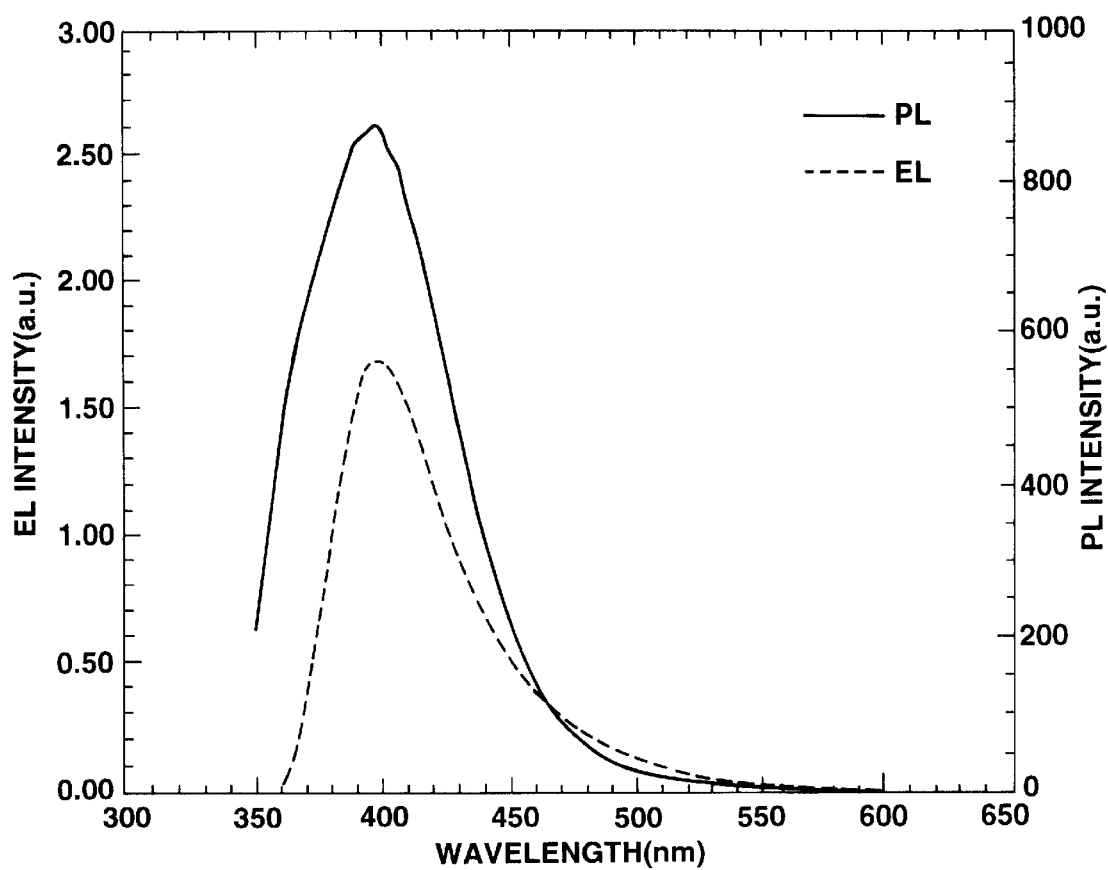
FIG. 11 is a graph showing the electric luminescent property of PVCz upon application of a voltage, together with the photo-luminescent property of PVCz upon incidence of light.

A photoconductive layer consisting of such a naphthalene derivative can selectively generate a photoelectromotive force upon incidence of light in the ultraviolet to blue wavelength range of 380 nm to 460 nm, and exhibits very high sensitivity with respect to EL light from PVCz, as shown in FIG. 11.

In each embodiment described above, as a material for the photoconductive layer, for example, the following material can also be used: an inorganic semiconductor such as amorphous selenium (a-Se), ZnS, or $SnO_x$, a charge transfer complex such as polyvinyl carbazole, or an organic compound material obtained by stacking an organic photocarrier generation layer (perylenes, quinoes, phthalocyanines, or the like) and an organic carrier transport layer (arylamines, hydrazines, oxazoles, or the like). As is apparent, when such a material absorbs photons in a specific wavelength range, it generates conduction carriers, and its impedance abruptly decreases. As a result, the material has electrical conductivity.

As a material for the photoconductive layer 221 for generating electron-hole pairs upon incidence of ultraviolet light, a semiconductor material having a forbidden band (energy gap) of 3.1 eV or more may be used.

(10th Embodiment)

Figure 29:
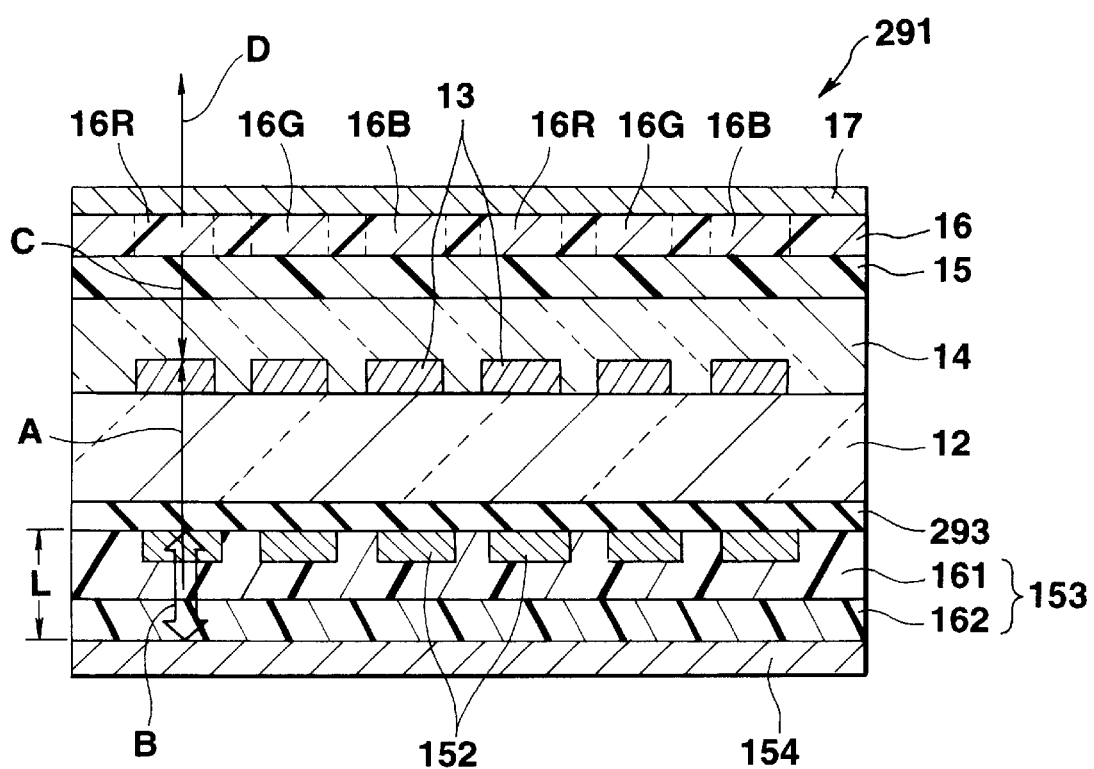
FIG. 29 is a sectional view showing a display device according to the 10th embodiment of the present invention, to which a half mirror is applied.
Figure 30:
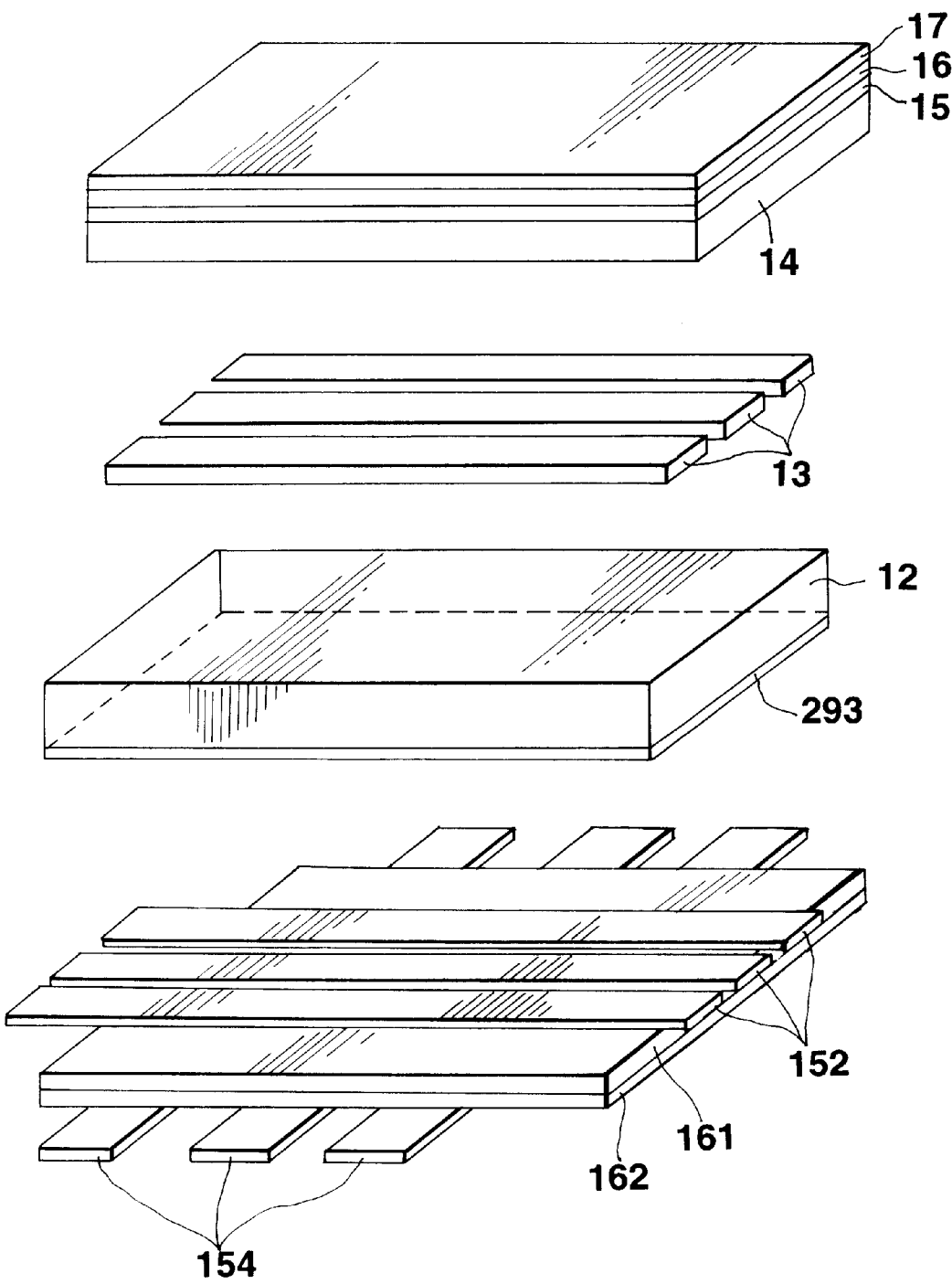
FIG. 30 is an exploded perspective view showing the display device to which the half mirror is applied.

FIG. 29 is a sectional view schematically showing a display device according to the 10th embodiment of the present invention. FIG. 30 is an exploded perspective view of the display device. Referring to FIG. 29, reference numeral 291 denotes a display device. The display device 291 is mainly constituted by an organic EL element for signal light and an organic EL element for display light.

As shown in FIGS. 29 and 30, the organic EL element for signal light includes a dielectric half mirror layer 293 formed on the lower surface a substrate 12 exhibiting transparency with respect to signal light and consisting of a glass material or a flexible polymer film. The half mirror layer 293 covers the entire emission area of the organic EL element for display light. The half mirror layer 293 is designed to transmit a predetermined proportion of light, of light propagating in a direction parallel to the direction of the normal to the surface of the half mirror layer 293 and having a wavelength λ.

A plurality of row electrodes 152 as first signal light electrodes are formed on the lower surface of the half mirror layer 293 to extend parallel to the row direction as the first direction.

The row electrodes 152 serve as anode electrodes and may consist of an electrode material exhibiting transparency with respect to signal light and having a predetermined work function. For example, ITO or IXO can be used. A first organic film 161 consisting of a mixture of PVCz and BND and serving as a hole transport layer and a substantial luminescent layer is formed on the surfaces (lower surfaces) of the row electrodes 152 and the half mirror layer 293. A second organic film 162 consisting of Alq3 having a thickness small enough to exhibit transparency with respect to signal light and serving as an electron transport layer is joined and stacked on the lower surface of the first organic film 161. The first and second organic films 161 and 162 constitute a signal light emitting layer 153. The signal light emitting layer 153 has transparency with respect to signal light.

A plurality of column electrodes 154 are formed on the lower surface of the second organic film 162 to extend parallel to the column direction perpendicular to the row direction so as to cross the row electrodes 152 through the signal light emitting layer 153. The column electrodes 154 serve as cathode electrodes. The column electrode is formed by a metal electrode consisting of MgIn, AlLi, MgAg, InAl, or the like, which has a lower work function than the material of the anode electrode and a property of reflecting signal light. The row and column electrodes 152 and 154 extend to the edges of the transparent substrate 12 to be connected to a drive IC (not shown). In this manner, a matrix drive organic EL element for signal light is formed.

In this embodiment, as shown in FIG. 29, a distance L between the half mirror layer 293 and the column electrodes 154 is set with respect to the wavelength ($\lambda$) of signal light in a predetermined wavelength range to satisfy the following equation:

$$L = n \cdot \lambda / 2$$

where n is a natural number, preferably 1 to 3.

Of the signal light propagating in a direction parallel to the direction of the normal to the surface of the half mirror layer 293, a predetermined proportion of light is transmitted through the half mirror layer 293. Remaining signal light reflected by the half mirror layer 293 is repeatedly reflected between the half mirror layer 293 and the column electrodes 154. Of this light, light propagating in directions other than the direction parallel to the direction of the normal to the surface of the half mirror layer 293 is attenuated and cannot be transmitted through the half mirror layer 293 because of a phase offset. In addition, light propagating in a direction substantially parallel to the direction of the normal to the surface of the half mirror layer 293 and having a wavelength of substantially $\lambda$ reaches the half mirror layer 293 again without a phase offset. Of this light, a predetermined proportion of light cannot be transmitted through the half mirror layer 293. When light is repeatedly reflected between the half mirror layer 293 and the column electrodes 154 in this manner, only signal light propagating in a direction substantially parallel to the direction of the normal to the surface of the half mirror layer 293 and having a wavelength of substantially $\lambda$ is transmitted through the half mirror layer 293. The amount of light transmitted through the half mirror layer 293 can therefore be controlled in accordance with the directionality of signal light.

The organic EL element for display light has a display area nearly equal in area to the entire emission area of the organiclightlement for signal light. The organic EL element for signal light is formed on the upper surface side of the substrate 12. A plurality of rear drive electrodes 13 consisting of, e.g., a transparent ITO material and serving as cathode electrodes are formed on the upper surface of the substrate 12. The rear drive electrodes 13 have the same shape as that of the row electrodes 152 so that they oppose and overlap each other when viewed two-dimensionally. A photoconductive layer 14 is formed on the substrate 12 and the rear drive electrodes 13 to cover the entire display area. The photoconductive layer 14 consists of a material which absorbs signal light to generate conduction carriers. For example, in this embodiment, zinc oxide containing eosine and amorphous silicon are used. An electron transport layer 15 consisting of Alq3 and a hole transport layer/luminescent layer 16 are formed on the entire upper surface of the photoconductive layer 14.

The luminescent layer 16 consists of PVCz and BND. Luminescent materials for emission of R (red) light, G (green) light, and B (blue) light are added in the respective dot portions (corresponding to the emission areas where the row and column electrodes 152 and 154 of the signal light device overlap each other through the signal light emitting layer 153) of the luminescent layer 16 to form a predetermined color matrix. Referring to FIG. 29, reference numerals 16R, 16G, and 16B denote the dot portions of the luminescent layer 16 which correspond to the R, G, and B emission areas. As a method of forming the luminescent layer 16, for example, the following methods can be used: a method of depositing a mixture of PVCz and BND on the electron transport layer 15, and impregnating the respective dot portions with corresponding luminescent materials; or a method of patterning an organic film containing luminescent materials in units of colors in accordance with the color matrix. A transparent front drive electrode 17 consisting of ITO and serving as an anode electrode is formed on the upper surface of the luminescent layer 16 to cover the entire display area.

In the organic EL element for signal light, which has the above arrangement, when a predetermined voltage is applied between the row and column electrodes 152 and 154, signal light containing ultraviolet light is emitted from a portion near the interface between the first organic film 161 and the second organic film 162. At this time, the signal light having the wavelength $\lambda$ and incident on the lower surface of the half mirror layer 293 and the upper surface of the column electrode 154 is repeatedly reflected between the half mirror layer 293 and the column electrode 154 and transmitted thereafter. Referring to FIG. 29, a thick arrow B indicates resonant light which is repeatedly reflected. With this operation, only the light propagating in a direction perpendicular to the surface of the signal light emitting layer 153 is incident on the EL element for display light owing to resonance. For this reason, of the signal light emitted from a predetermined address of the EL element for signal light, signal light traveling toward a predetermined dot of the photoconductive layer 14 which corresponds to this address is maximized in light amount. In contrast to this, signal light obliquely incident on the half mirror layer is substantially not transmitted, and hence is not irradiated on any non-selected area of the photoconductive layer 14. For this reason, electron-hole pairs enough to inject carriers into the photoconductive layer 14 are not generated in portions of the luminescent layer 16 and the electron transport layer 15 which correspond to the non-selected areas. Therefore, with an arrangement for controlling the amount of signal light in accordance with the propagating direction of the signal light as in this embodiment, a display device free from crosstalk can be realized.

The overall operation of a display device 11 will be described below.

First of all, in the organic EL element for signal light, when a predetermined voltage is applied between the row and column electrodes 152 and 154 selected by line-sequential scanning, signal light (indicated by an arrow A in FIG. 29) containing ultraviolet light and propagating in a direction perpendicular to the signal light emitting layer 153 is irradiated onto the photoconductive layer 14. At this time, signal light A emitted from a predetermined address of the signal light emitting layer 153 is not incident on that dot area of the photoconductive layer 14 which is adjacent to the corresponding dot area and hence generates no electron-hole pairs. In this case, since the signal light emitting layer 153 is sufficiently close to the photoconductive layer 14, the signal light can arrive at the photoconductive layer 14 while maintaining a practically sufficient spatial frequency. As described above, electron-hole pairs are generated in the portion of the photoconductive layer 14 on which the signal light is incident, and the photoconductive layer 14 is set in a state that allows injection of electrons into the third organic film 15 using a tunneling effect based on storage of holes at the interface. With this operation, the voltage which has been applied between the front drive electrode 17 and the rear drive electrode 13 is applied to predetermined dot portions of the third and fourth organic films 15 and 16. Note that a DC drive voltage, a pulse voltage, an AC voltage, or the like can be applied between the drive electrodes 13 and 17. As a result, as described above, the organic EL element for display light emits light, and display light beams (an arrow D in FIG. 29) colored by the respective luminescent materials propagate forward. At the same time, return light indicated by an arrow C propagates backward. Since this return light C is incident on the photoconductive layer 14, the photoconductive layer 14 is re-excited to generate new electron-hole pairs. In addition, of the electron-hole pairs generated in the Schottky junction between the rear drive electrode 13 and the photoconductive layer 14 upon incidence of the signal light A, the holes are stored at the interface between the photoconductive layer 14 and the rear drive electrode 13 to generate an electron tunnel owing to the potential difference between the rear drive electrode 13 and the front drive electrode 17. As a result, the electrons are injected into the photoconductive layer 14. The photoconductive layer 14 is therefore kept in the state that allows injection of electrons into the third organic film 15. For this reason, in the selection period, carriers are kept injected into the corresponding areas of the third and fourth organic films. In this state, since the luminescent layer 16 continues to emit light for a sufficiently long period of time relative to 1 frame period, even if the row and column electrodes 152 and 154 of the organic EL element for signal light are set in the non-selected state, the luminescent layer 16 continues its light emission. Consequently, light emission is sustained until the next scanning operation owing to line-sequential scanning. Note that the stored carriers can be refreshed by applying a reset voltage to the drive electrodes 13 and 17 immediately before the next scanning operation.

In this embodiment, as described above, since signal light emitted from a predetermined address of the organic EL element for signal light is reliably incident on a predetermined dot of the organic EL element for display light which corresponds to the predetermined address, display can be performed without crosstalk. In addition, since display light emission continues until the next line-sequential scanning operation, high-quality display can be performed. Since the organic EL element for signal light and the organic EL element for display light can be formed on a single transparent substrate 12, reductions in the profile and weight of the display device can be realized. In the conventional organic electric luminescent element, since each pixel must sustain light emission for 1 frame period in high-duty matrix drive, a very high initial voltage must be set. As a result, the life of the EL display element itself is shortened. According to this embodiment, a good memory function or proper hysteresis based on return light can be realized for each pixel with a simple structure without using switching elements typified by TFTs or elements having memory functions such as ferroelectric liquid crystal elements, thereby realizing high-quality display under a high-duty drive condition. For the same reason, since the luminance required for the EL display element to obtain a desired display luminance can be decreased, a longer life of the EL display element can be expected. In addition, since a low-luminance area in which the luminous efficacy of the organic EL element is maximized can be used, the overall power consumption of the element can be reduced. Furthermore, in this embodiment, the organic EL elements can be easily formed on a single substrate 12. This structure allows high productivity in manufacturing large-screen displays as compared with TFT displays, ferroelectric liquid crystal displays, and plasma displays. This embodiment is also free from a decrease in opening ratio caused when TFTs and bus lines of a TFT display device block light, and hence is superior to TFT drive elements in display luminance and luminous efficacy. Moreover, the patterning and alignment techniques for this structure are much easier than those in the TFT manufacturing process, and the film formation step can be performed at a relatively low temperature.

(11th Embodiment)

Figure 31:
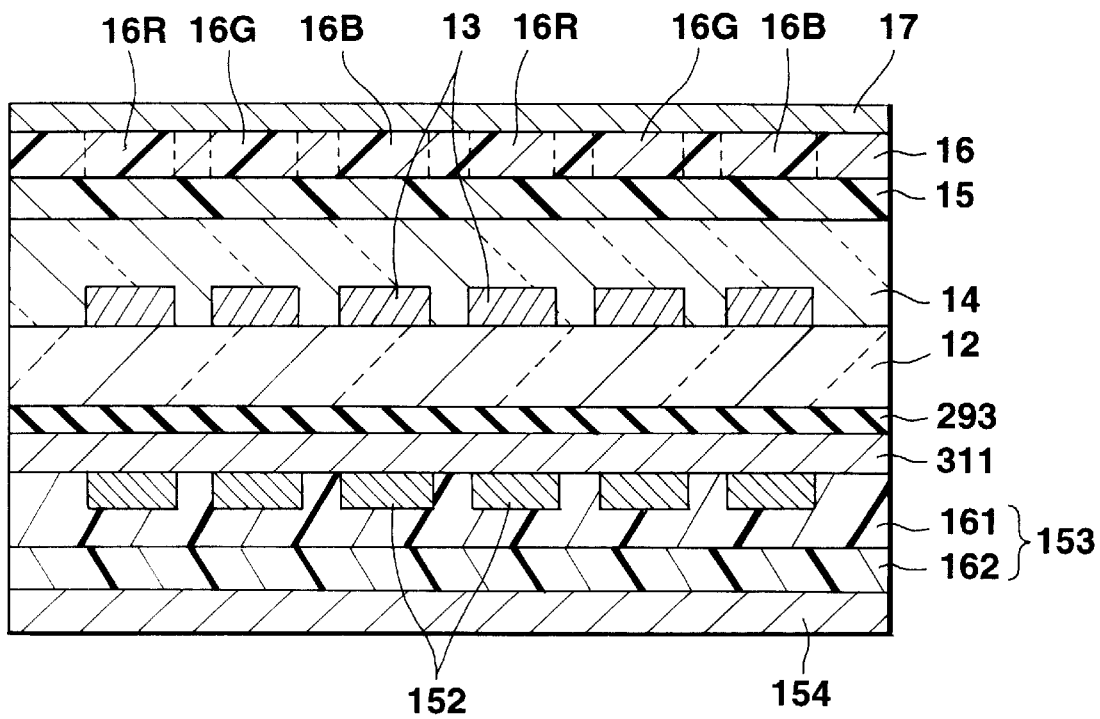
FIG. 31 is a sectional view showing a display device according to the 11th embodiment of the present invention, to which an adjusting film for setting the wavelength of signal light to be incident on a photoconductive layer is applied.

FIG. 31 is a sectional view showing a display device according to the 11th embodiment.

In this embodiment, in order to set a distance L between the opposing surfaces of the half mirror layer 293 and the column electrode 154 in the 10th embodiment to $$L = n\cdot\lambda/2$$

where n is a natural number.

A resonance distance adjusting film 311 which is a dielectric film consisting of, e.g., silicon nitride (SiN) is interposed between the half mirror layer 293 and the row electrodes 152. In the display device of this embodiment, a half mirror layer 293 is formed on the lower surface of a transparent substrate 12 in advance, and the resonance distance adjusting film 311 is formed on the lower surface of the half mirror layer 293 to have a predetermined thickness upon adjustment, thereby reliably forming a microresonator between column electrodes 154 and the half mirror layer 293. In addition, by adjusting the thickness of the resonance distance adjusting film 311, the resonator structure can be designed to be suited for the wavelength λ of signal light emitted from the particular organic EL element for signal light in question. Note that the remaining arrangement, function/operation, and effect of this embodiment are substantially the same as those of the 10th embodiment.

(12th Embodiment)

Figure 32:
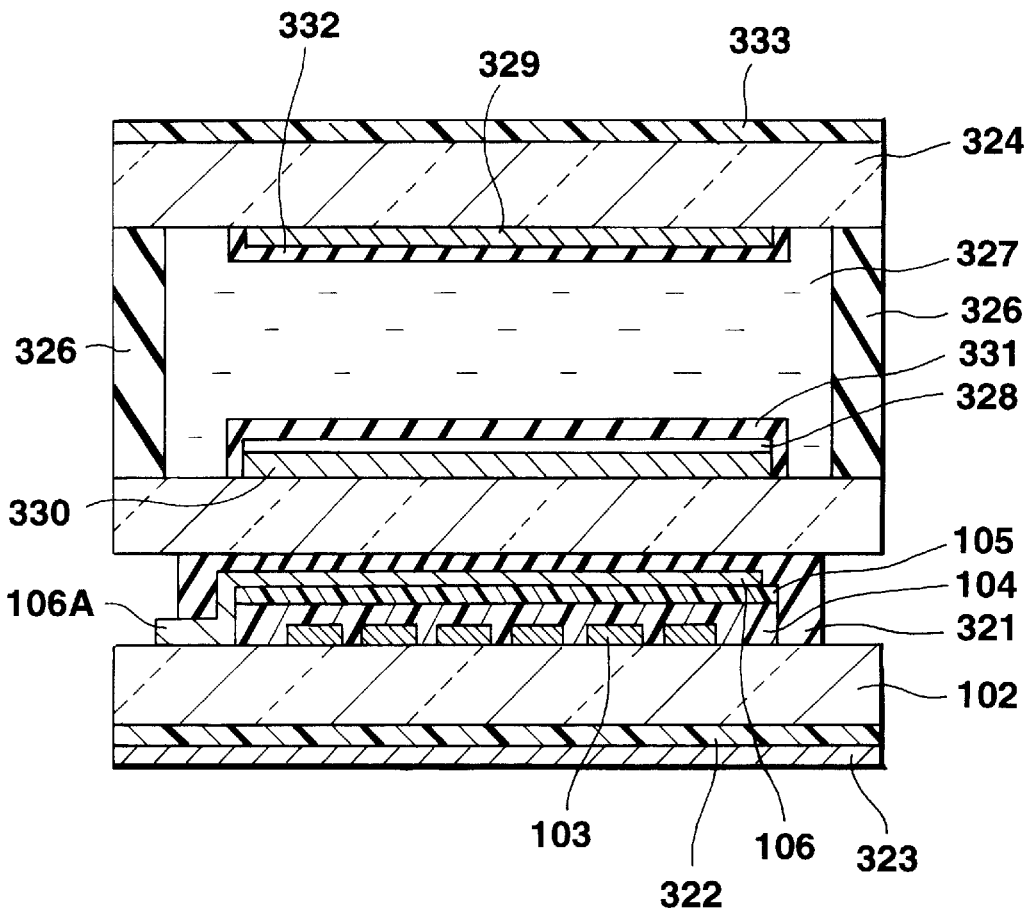
FIG. 32 is a sectional view showing a display device according to the 12th embodiment of the present invention, which has a liquid crystal display element and an organic EL element for signal light.

FIG. 32 is a sectional view schematically showing a display device according to the 12th embodiment of the present invention. This display device is mainly constituted by an organic EL element for signal light and a liquid crystal display element having a photoelectric conversion layer. The organic EL element for signal light will be described first.

A plurality of cathode electrodes 103 as first signal electrodes are formed on the upper surface of a transparent substrate 102 consisting of a glass material or a polymer film to extend in the row direction (second direction) and be parallel to each other. Each row electrode 103 has a thickness of about 250 Å to 1,000 Å and serves as a cathode electrode. An electron transport layer 104 consisting of Alq3 and having a thickness of about 500 Å is formed on the upper surfaces of the row electrodes 103 and the transparent substrate 102. A luminescent layer 105, consisting of PVCz and BND, having a thickness of about 1,000 Å, and serving as a single hole transport layer is formed on the electron transport layer 104.

A plurality of column electrodes 106 are formed on the upper surface of the luminescent layer 105 to extend in the column direction (second direction) crossing (at right angles) the row electrodes 103. Each column electrode 106 serves as an anode electrode and exhibits transparency with respect to light components of signal light which fall within part of the ultraviolet range (the wavelength range of 350 nm to 400 nm). For example, each column electrode 106 consists of zinc oxide sensitized by eosine.

A protective film 321 having transparency is formed to cover the luminescent layer 105 and the column electrodes 106. Terminal portions 106A of the column electrodes 106 and the terminal portions of the row electrodes 103 are not covered by the protective film 321 but are exposed. As the protective film 321, a film having transparency with respect to light in the ultraviolet and visible ranges, e.g., a silicon nitride film or a silicon oxide film, can be used. The protective film 321 serves to prevent oxidation of the organic layers 104 and 105 and the row electrodes 103 and also prevent their characteristics from deteriorating due to humidity. If a member susceptible to oxidation is used for the row electrode 103 in consideration of the work function value, the exposed surface of the terminal portion 106A may be plated with a member resistant to oxidation. A rear polarizing plate 322 having a linear polarization axis is formed on the lower surface of the transparent substrate 102. A reflecting plate 323 made of an aluminum (Al) film having transparency with respect to the visible range is formed on the lower surface of the rear polarizing plate 322.

In the organic EL element for signal light, which has the above arrangement, when an electric field is applied between the row and column electrodes 103 and 106, signal light containing ultraviolet light is emitted from a portion near the interface between the luminescent layer 105 and the electron transport layer 104.

The arrangement of the liquid crystal display element will be described next. The liquid crystal display element to be combined with the organic EL element for signal light, which has the above arrangement, has a display area roughly equal in area to the emission area of the organic EL element for display light. This liquid crystal display element includes a pair of a front transparent substrate 324 and a rear transparent substrate 325, a TN liquid crystal 327 sealed between the transparent substrates with a seal member 326, a photoelectric conversion layer 328, a front drive electrode 329, and a plurality of rear drive electrodes 330 which have the same shape as that of the column electrodes 106 so that they are superposed on each other when viewed two-dimensionally. These components constitute a TN cell exhibiting optical rotatory power. The photoelectric conversion layer 328 is formed on the upper surface of the rear drive electrode 330. A rear aligning film 331 is formed to cover the rear drive electrode 330 and the photoelectric conversion layer 328.

The photoelectric conversion layer 328 consists of a material which absorbs photons in a specific wavelength range to generate conduction carriers. As such a material for the photoelectric conversion layer 328, for example, the following material can be used: zinc oxide, zinc oxide containing eosine, an inorganic semiconductor such a-Si, a-Se, ZnS, SrTiO$_3$, GaN, CdS, or SnO$_x$, or an organic compound material obtained by stacking an organic photo-carrier generation layer (perylenes, quinoes, phthalocyanines, or the like) and an organic carrier transport layer (arylamines, hydrazines, oxazoles, or the like).

Such a material absorbs photons in a specific wavelength range to generate electron-hole pairs, and can hold the electrons and the holes for a predetermined period of time. In this embodiment, the photoelectric conversion layer 328 uses ZnO, which has a property of absorbing signal light and exhibits a sharp spectral sensitivity peak in the ultraviolet range. ZnO does not absorb light in the visible range.

A single front drive electrode 329 consisting of ITO is formed on the lower surface of the front transparent substrate 324 to cover the entire display area. A front aligning film 332 is formed to cover the front drive electrode 329. A front polarizing plate 333 having a linear polarization axis is formed on the upper surface of the front transparent substrate 324.

Figure 33A:
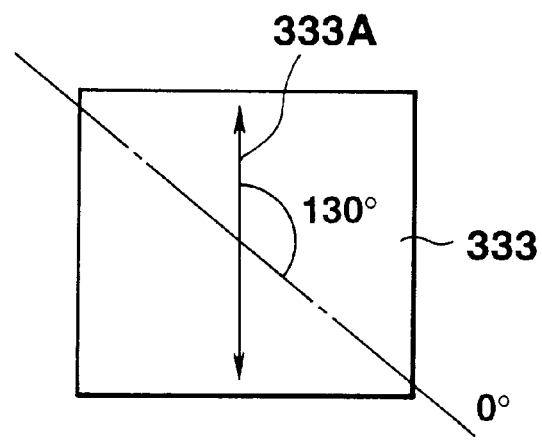
FIG. 33A is a view showing the direction of the polarization axis of the upper polarizing plate of the liquid display element.
Figure 33B:
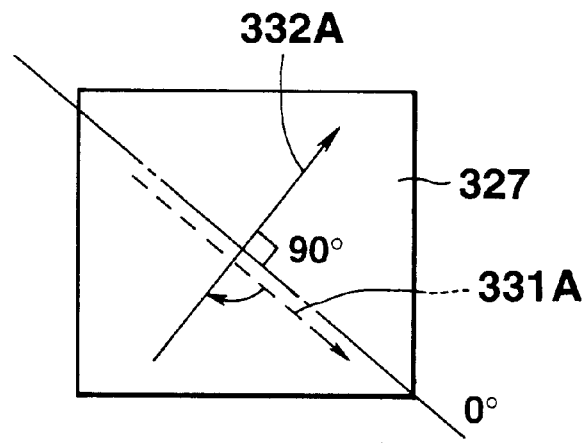
FIG. 33B is a view showing the aligning directions of the liquid display.

The surface of the rear aligning film 331 has undergone an aligning treatment such as rubbing in a predetermined direction 331A (the direction of 0°) in FIG. 33B. The surface of the front aligning film 332 has undergone an aligning treatment such as rubbing in a direction 332A (the direction of about 90° with respect to the direction 331A of the aligning treatment for the rear aligning film 331 in the counterclockwise direction) in FIG. 33B.

As the TN liquid crystal 327, a nematic liquid crystal doped with a chiral material is used. The TN liquid crystal 327 is twisted about 90° from the rear transparent substrate 325 to the front transparent substrate 324 in accordance with the aligning treatments applied to the aligning films 331 and 332.

Figure 33C:
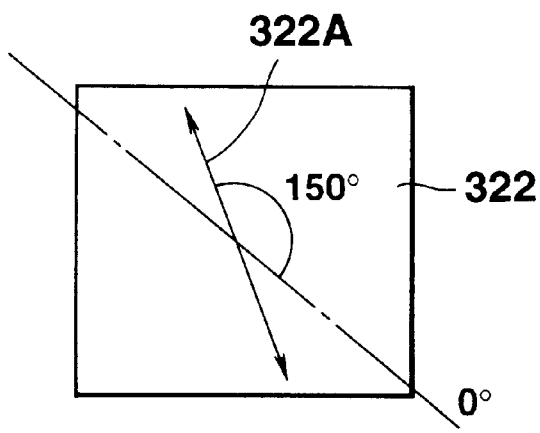
FIG. 33C is a view showing the direction of the polarization axis of the lower polarizing plate of the liquid display element.

As shown in FIG. 33A, a polarization axis 333A of the front polarizing plate 333 is set at 130° with respect to the aligning treatment direction 331A in the counterclockwise direction. As shown in FIG. 33C, a polarization axis 322A of the rear polarizing plate 322 is set at 150° with respect to the aligning treatment direction 331A in the counterclockwise direction. It suffices if the polarization axis 333A of the front polarizing plate 333 is at 20° to 70°, preferably 35° to 50°, with respect to the aligning treatment direction 332A in the clockwise or counterclockwise direction. It also suffices if the polarization axis 322A of the rear polarizing plate 322 is at 20° to 70°, preferably 25° to 45°, with respect to the aligning treatment direction 331A in the clockwise or counterclockwise direction.

Figure 34:
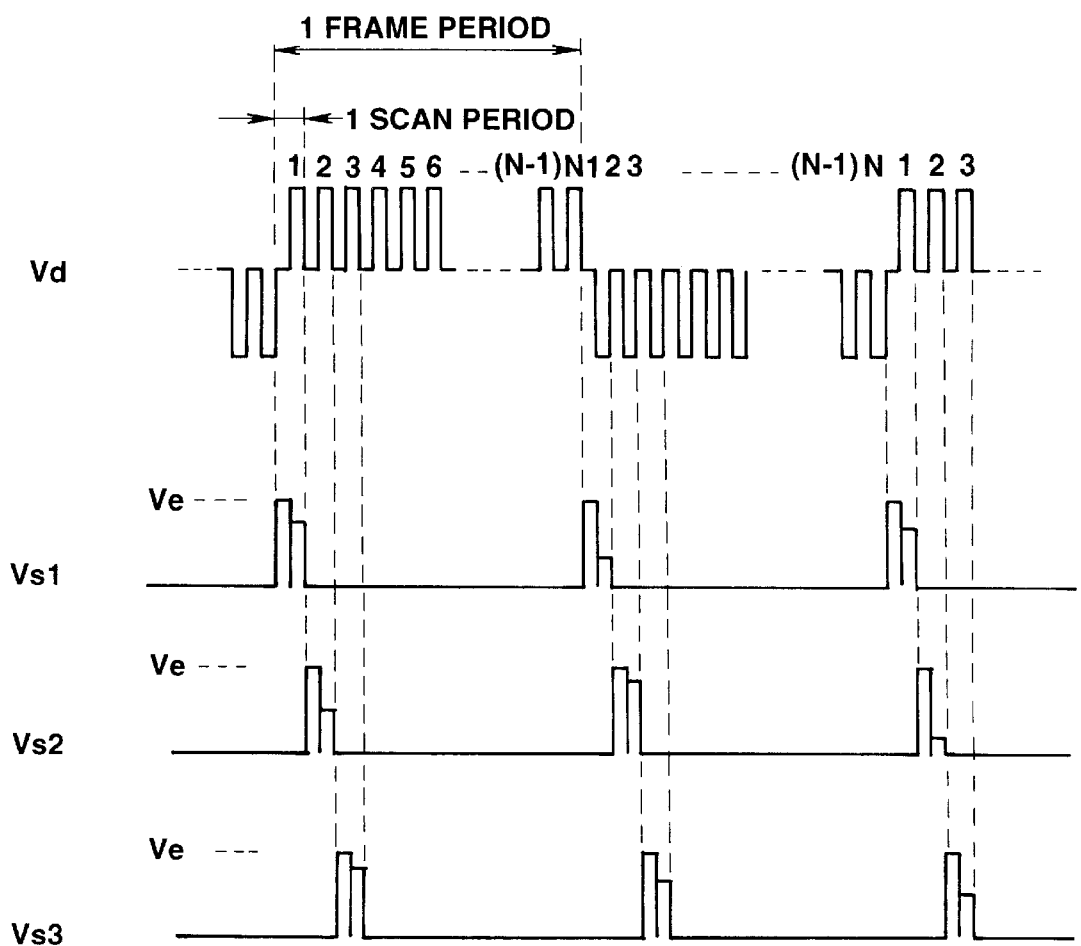
FIG. 34 is a timing chart showing drive waveforms to be applied to the liquid crystal display element and the organic EL element for signal light according to the present invention.

FIG. 34 is a timing chart showing a drive control method for the display device and, more particularly, a liquid crystal drive voltage waveform Vd and emission pulses (including erase light pulses and write light pulses) at the respective pixel addresses.

The drive voltage pulse Vd indicates a pulse train which is sequentially applied between the N rear drive electrodes 330 and the front drive electrode 329 and is synchronized with the line-sequential drive operation for the row and column electrodes 103 and 106 of the organic EL element for signal light. The drive voltage waveform Vd is inverted every 1 frame period. 1 scan period for the drive voltage waveform Vd to be applied to one rear drive electrode 330 is divided into at least two periods to apply a selection potential and the ground potential. In this case, the selection potential is a potential to be applied during the write period, and the ground potential is a potential to be applied during the erase period. As shown in FIG. 34, it is preferable that the first half period of 1 scan period be set as an erase period, and the second half period be set as a write period. Reference symbols Vs1, Vs2, and Vs3 denote emission pulses for specific dot portions in the X-Y matrix constituted by the row and column electrodes 103 and 106. Reference symbol Vs1 denotes an emission pulse for a given dot portion on the first select line; Vs2, an emission pulse for a given dot portion on the second select line; and Vs3, an emission pulse for a given dot portion on the third select line. One of the row and column electrodes is set as a select line, and the other electrode is set as a data line.

These select and data lines output a sufficient erase voltage Ve and emit reset signal light during the erase period. At this time, since the value of Vd corresponds to the ground potential, carriers stored in the photoelectric conversion layer 328 during the scan period before the liquid crystal 327 is aligned are refreshed.

Subsequently, in the write period, a write voltage based on desired data is applied to the row and column electrodes 103 and 106 to emit write signal light to a predetermined dot portion of the photoelectric conversion layer 328. Since the write signal light is obtained by applying a voltage corresponding to the display gradation level of each display pixel to each data line with the potential of each select line being fixed, only a selection potential and the ground potential for a front drive electrode 33 and a rear drive electrode 28 of a liquid crystal display element 13 need to be controlled regardless of the gradation level. In this embodiment, pulse height modulation is performed. However, pulse width modulation may be performed. In the write period, since the voltage applied to the liquid crystal 327 is a selection potential, a desired electric field corresponding to write signal light is applied to the liquid crystal 327 to perform gradation display corresponding to the write signal light. The display device of this embodiment can control the voltage to be applied to the liquid crystal display element through the photoconductive layer in accordance with the amount of signal light by using the polarizing effects of the liquid crystal and the polarizing plate. This device can therefore perform color display based on three or more colors.

The driving method for the display device of this embodiment has been described above. By using this method, data erase can be arbitrarily performed as well as data write and setting of the data hold time. The driving method of this embodiment is characterized in that driving with a memory function can be performed without crosstalk, obtaining substantially the same effects as those obtained by a liquid crystal display device using TFTs. In addition, since static liquid crystal driving can be performed with a simple matrix electrode structure, high-quality display can be performed.

The display devices to which the present invention is applied are not limited the arrangements of the above embodiments. For example, in addition to the liquid crystal display element of the twisted nematic (TN) liquid crystal mode, liquid crystal display elements based on the following modes can be used: a ferroelectric liquid crystal (FLC) mode, an anti-ferroelectric liquid crystal (AFLC) mode, a polymer dispersed liquid crystal (PDLC) mode, a phase change (PC) mode, a homogeneous alignment mode, a homeotropic alignment mode, and a hybrid alignment mode. In this case, it suffices if a polarizing plate, a retardation plate, an aligning film, and the like are set in accordance with each liquid crystal mode. For example, in the PDLC liquid crystal mode, no polarizing plate is required, and hence no aligning film is required. This embodiment uses a reflection type liquid crystal display element designed to perform multicolor display using the polarizing effects of the liquid crystal and the polarizing plate. However, a liquid crystal display element having a color filter may be used. Furthermore, as is apparent, the present invention can be applied to a liquid crystal display element using a polarization axis having a linear polarization property and a liquid crystal multicolor display element including a retardation plate having an elliptic polarization property.

In the above embodiment, the photoelectric conversion layer 328 consists of ZnO. In the present invention, however, each of photoelectric conversion layers respectively made of various photoelectric conversion materials, or a photoelectric conversion layer made of some of these materials may contain a material for adjusting the electric resistivity of the photoelectric conversion layer, e.g., a perylene pigment or a naphthalene derivative. Other materials which can be used for photoelectric conversion layers are: inorganic semiconductors such a-Si, a-Se, ZnS, and $SnO_x$, and organic compound materials obtained by stacking organic photocarrier generation layers (perylenes, quinoes, phthalocyanines, and the like) and organic carrier transport layers (arylamines, hydrazines, oxazoles, and the like).

In the above embodiment, the half mirror may be placed between the organic EL element for signal light and the liquid crystal display element, and the distance L between the row electrode 103 having the reflecting property and the half mirror may be set with respect to the wavelength range $\lambda$ as follows:

$$L = n \cdot \lambda / 2$$

where n is a natural number, with this setting, address light is repeatedly reflected between the half mirror and the reflecting electrode to continuously transmit in-phase address light.

In the above embodiment, during 1 scan period, erase pulses and write data pulses are continuously output at a corresponding one select line or display pixel. However, in order to reduce the noise caused by erase pulses in the write period, the ground potential may be applied during the period between the erase pulse and the write data pulse in 1 scan period. In addition, the ground potential is synchronized with a select line erase pulse in the erase period, and a selection voltage is synchronized with a write data pulse for a select line in the write period. However, the present invention is not limited to this. For example, after the write data pulse is applied, a select voltage may be applied in the time interval between the instant at which the organic EL element for signal light irradiates write signal light onto the photoconductive conversion layer and the instant at which carriers are generated, i.e., in synchronism with the timing at which carriers are generated by write signal light after application of the write data pulse.

In each embodiment described above, the organic EL element for display light and the organic EL element for signal light may be covered with insulating films for protection except electrode terminals.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A display device for performing a display operation, comprising:

an addressing element including an organic electric luminescent element having a plurality of areas arranged in a matrix for emitting signal light, a plurality of first striped electrodes facing one surface of said organic electric luminescent element and extending in a predetermined direction, and a plurality of second striped electrodes facing another surface of said organic electric luminescent element and extending in a direction perpendicular to said first striped electrodes, said second striped electrodes being transparent with respect to the signal light;

a display element including a light-receiving element for receiving the signal light and generating carriers corresponding to the signal light, an organic electric luminescent layer adjacent to said light-receiving element, a plurality of first display electrodes each facing one surface of said light-receiving element, and a second display electrode facing one surface of said organic electric luminescent layer; and a half mirror interposed between said addressing element and said light-receiving element and set so that a distance L to said first striped electrodes and a wavelength $\lambda$ of the signal light substantially satisfy $L=n\cdot\lambda/2$, where n is a natural number;

wherein said organic electric luminescent layer of said display element emits display light when the carriers generated by said light-receiving element are recombined in said organic electric luminescent layer responsive to a voltage applied between said first display electrodes and said second display electrode.

2. A display device according to claim 1, wherein the display light includes light in a wavelength range which causes said light-receiving element to generate the carriers.

3. A display device according to claim 1, wherein the signal light includes light in a wavelength range below a wavelength range of visible light.

4. A display device according to claim 1, wherein said first striped electrodes of said addressing element have reflecting properties.

5. A display device according to claim 1, wherein said organic electric luminescent layer of said display element emits the display light at a luminance corresponding to an amount of the signal light incident on said light-receiving element.

6. A display device according to claim 1, wherein said first display electrodes comprise a cathode electrode, and said second display electrode comprises an anode electrode.

7. A display device according to claim 1, wherein said organic electric luminescent layer has an electric luminescent property of emitting light upon an injection of the carriers from said first display electrode and said second display electrode, and a photo-luminescent property of emitting light upon an incidence of the signal light.

8. A display device according to claim 1, wherein said display element comprises an insulating layer interposed between said addressing element and said light-receiving element.

9. A display device according to claim 1, further comprising a light propagating direction control element, interposed between said addressing element and said light-receiving element, for controlling a propagating direction of the signal light emitted by said addressing element so as to cause the signal light to be incident on said light-receiving element.

* * * * *